US006968408B2

(12) United States Patent
Joshi et al.

(10) Patent No.: US 6,968,408 B2
(45) Date of Patent: Nov. 22, 2005

(54) LINKING ADDRESSABLE SHADOW PORT AND PROTOCOL FOR SERIAL BUS NETWORKS

(75) Inventors: Rakesh N. Joshi, McKinney, TX (US); Mark S. Gary, McKinney, TX (US); Kenneth L. Williams, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 287 days.

(21) Appl. No.: 10/331,628

(22) Filed: Dec. 30, 2002

(65) Prior Publication Data

US 2004/0037303 A1    Feb. 26, 2004

Related U.S. Application Data

(60) Provisional application No. 60/401,908, filed on Aug. 8, 2002.

(51) Int. Cl.[7] .................. G06F 13/00; G01R 31/28
(52) U.S. Cl. .................. 710/110; 714/30; 370/360
(58) Field of Search .................. 710/3, 38, 100, 710/104, 107, 110, 316; 714/30, 724; 370/241, 370/251, 356, 360, 362; 709/208

(56) References Cited

U.S. PATENT DOCUMENTS

| 5,483,518 | A | 1/1996 | Whetsel |
|---|---|---|---|
| 5,581,541 | A | 12/1996 | Whetsel |
| 5,617,420 | A | 4/1997 | Whetsel |
| 5,640,521 | A | 6/1997 | Whetsel |
| 5,875,353 | A | 2/1999 | Whetsel |
| 6,363,443 | B1 | 3/2002 | Whetsel |
| 6,490,641 | B2 * | 12/2002 | Whetsel ............ 710/104 |

OTHER PUBLICATIONS

"Universal serial bus (USB) to universal interface using field programmable gate arrays (FPGA) to mimic traditional hardware [military aircraft testing applications]" by Stong, N. (abstract only) Publication date: Sep. 22-25, 2003.*

"Testing methodology for FireWire" by Malatii, I.; Blancha, B. (abstract only) Publication Date: Jul.-Sep. 1999.*

IEEE Standard Test Assess Port and Boundary-Scan Architecture, May 21, 1990, pp. i-xi and 1-1 through 10-12, IEEE Std 1149.1-1990, Published by the Institute of Electrical and Electronics Engineers, Inc. New York, NY, U.S.A.

* cited by examiner

Primary Examiner—Gopal C. Ray
(74) Attorney, Agent, or Firm—William B. Kempler; W. James Brady, III; Frederick J. Telecky, Jr.

(57) ABSTRACT

Linking addressable shadow port (LASP) and protocol allows addressing the LASP and configuring the connection of multiple Secondary Test Access Ports (TAPs) of the LASP using a single protocol or protocol bypass inputs. Multiple LASP are cascaded and the connection of their secondary TAPs are configured using the LASP protocol or protocol bypass inputs.

9 Claims, 32 Drawing Sheets

FIG. 39

| POSITION | CONFIGURATION | | | STAP CONFIGURATION | | | SCAN-PATH | $\overline{CON}_2$ | $\overline{CON}_1$ | $\overline{CON}_0$ |
|---|---|---|---|---|---|---|---|---|---|---|
| | 2 | 1 | 0 | STAP$_2$ | STAP$_1$ | STAP$_0$ | | | | |
| SINGLE DEVICE | 1 | 1 | 1 | INACTIVE | INACTIVE | INACTIVE | NONE | 1 | 1 | 1 |
| | 1 | 1 | 0 | INACTIVE | INACTIVE | ACTIVE | PTDI-STAP$_0$-PTDO | 1 | 1 | 0 |
| | 1 | 0 | 1 | INACTIVE | ACTIVE | INACTIVE | PTDI-STAP$_1$-PTDO | 1 | 0 | 1 |
| | 1 | 0 | 0 | INACTIVE | ACTIVE | ACTIVE | PTDI-STAP$_0$-STAP$_1$-PTDO | 1 | 0 | 0 |
| | 0 | 1 | 1 | ACTIVE | INACTIVE | INACTIVE | PTDI-STAP$_2$-PTDO | 0 | 1 | 1 |
| | 0 | 1 | 0 | ACTIVE | INACTIVE | ACTIVE | PTDI-STAP$_0$-STAP$_2$-PTDO | 0 | 1 | 0 |
| | 0 | 0 | 1 | ACTIVE | ACTIVE | INACTIVE | PTDI-STAP$_1$-STAP$_2$-PTDO | 0 | 0 | 1 |
| | 0 | 0 | 0 | ACTIVE | ACTIVE | ACTIVE | PTDI-STAP$_0$-STAP$_1$-STAP$_2$-PTDO | 0 | 0 | 0 |
| FIRST DEVICE IN CASCADE CHAIN | 1 | 1 | 1 | INACTIVE | INACTIVE | INACTIVE | NONE | 1 | 1 | 1 |
| | 1 | 1 | 0 | INACTIVE | INACTIVE | ACTIVE | PTDI-STAP$_0$-CTDO | 1 | 1 | 0 |
| | 1 | 0 | 1 | INACTIVE | ACTIVE | INACTIVE | PTDI-STAP$_1$-CTDO | 1 | 0 | 1 |
| | 1 | 0 | 0 | INACTIVE | ACTIVE | ACTIVE | PTDI-STAP$_0$-STAP$_1$-CTDO | 1 | 0 | 0 |
| | 0 | 1 | 1 | ACTIVE | INACTIVE | INACTIVE | PTDI-STAP$_2$-CTDO | 0 | 1 | 1 |
| | 0 | 1 | 0 | ACTIVE | INACTIVE | ACTIVE | PTDI-STAP$_0$-STAP$_2$-CTDO | 0 | 1 | 0 |
| | 0 | 0 | 1 | ACTIVE | ACTIVE | INACTIVE | PTDI-STAP$_1$-STAP$_2$-CTDO | 0 | 0 | 1 |
| | 0 | 0 | 0 | ACTIVE | ACTIVE | ACTIVE | PTDI-STAP$_0$-STAP$_1$-STAP$_2$-CTDO | 0 | 0 | 0 |

FIG. 40

| POSITION | CONFIGURATION | | | STAP CONFIGURATION | | | SCAN-PATH | $\overline{CON}_2$ | $\overline{CON}_1$ | $\overline{CON}_0$ |
|---|---|---|---|---|---|---|---|---|---|---|
| | 2 | 1 | 0 | $STAP_2$ | $STAP_1$ | $STAP_0$ | | | | |
| LAST DEVICE IN CASCADE CHAIN | 1 | 1 | 1 | INACTIVE | INACTIVE | INACTIVE | NONE | 1 | 1 | 1 |
| | 1 | 1 | 0 | INACTIVE | INACTIVE | ACTIVE | CTDI-$STAP_0$-PTDO | 1 | 1 | 0 |
| | 1 | 0 | 1 | INACTIVE | ACTIVE | INACTIVE | CTDI-$STAP_1$-PTDO | 1 | 0 | 1 |
| | 1 | 0 | 0 | INACTIVE | ACTIVE | ACTIVE | CTDI-$STAP_0$-$STAP_1$-PTDO | 1 | 0 | 0 |
| | 0 | 1 | 1 | ACTIVE | INACTIVE | INACTIVE | CTDI-$STAP_2$-PTDO | 0 | 1 | 1 |
| | 0 | 1 | 0 | ACTIVE | INACTIVE | ACTIVE | CTDI-$STAP_0$-$STAP_2$-PTDO | 0 | 1 | 0 |
| | 0 | 0 | 1 | ACTIVE | ACTIVE | INACTIVE | CTDI-$STAP_1$-$STAP_2$-PTDO | 0 | 0 | 1 |
| | 0 | 0 | 0 | ACTIVE | ACTIVE | ACTIVE | CTDI-$STAP_0$-$STAP_1$-$STAP_2$-PTDO | 0 | 0 | 0 |
| NOT FIRST NOR LAST DEVICE IN CASCADE CHAIN | 1 | 1 | 1 | INACTIVE | INACTIVE | INACTIVE | CTDI-CTDO | 1 | 1 | 1 |
| | 1 | 1 | 0 | INACTIVE | INACTIVE | ACTIVE | CTDI-$STAP_0$-CTDO | 1 | 1 | 0 |
| | 1 | 0 | 1 | INACTIVE | ACTIVE | INACTIVE | CTDI-$STAP_1$-CTDO | 1 | 0 | 1 |
| | 1 | 0 | 0 | INACTIVE | ACTIVE | ACTIVE | CTDI-$STAP_0$-$STAP_1$-CTDO | 1 | 0 | 0 |
| | 0 | 1 | 1 | ACTIVE | INACTIVE | INACTIVE | CTDI-$STAP_2$-CTDO | 0 | 1 | 1 |
| | 0 | 1 | 0 | ACTIVE | INACTIVE | ACTIVE | CTDI-$STAP_0$-$STAP_2$-CTDO | 0 | 1 | 0 |
| | 0 | 0 | 1 | ACTIVE | ACTIVE | INACTIVE | CTDI-$STAP_1$-$STAP_2$-CTDO | 0 | 0 | 1 |
| | 0 | 0 | 0 | ACTIVE | ACTIVE | ACTIVE | CTDI-$STAP_0$-$STAP_1$-$STAP_2$-CTDO | 0 | 0 | 0 |

FIG. 41

| | $\overline{BYP}$ | | | | | | STAP CONFIGURATION | | | SCAN-PATH | $\overline{CON}_2$ | $\overline{CON}_1$ | $\overline{CON}_0$ |
|---|---|---|---|---|---|---|---|---|---|---|---|---|---|
| 5 | 4 | 3 | 2 | 1 | 0 | | $STAP_2$ | $STAP_1$ | $STAP_0$ | | | | |
| 0 | 0 | 0 | 1 | 1 | 1 | | INACTIVE | INACTIVE | INACTIVE | NONE | 1 | 1 | 1 |
| 0 | 0 | 0 | 1 | 1 | 0 | | INACTIVE | INACTIVE | ACTIVE | PTDI-$STAP_0$-PTDO | 1 | 1 | 0 |
| 0 | 0 | 0 | 1 | 0 | 1 | | INACTIVE | ACTIVE | INACTIVE | PTDI-$STAP_1$-PTDO | 1 | 0 | 1 |
| 0 | 0 | 0 | 1 | 0 | 0 | | INACTIVE | ACTIVE | ACTIVE | PTDI-$STAP_0$-$STAP_1$-PTDO | 1 | 0 | 0 |
| 0 | 0 | 0 | 0 | 1 | 1 | | ACTIVE | INACTIVE | INACTIVE | PTDI-$STAP_2$-PTDO | 0 | 1 | 1 |
| 0 | 0 | 0 | 0 | 1 | 0 | | ACTIVE | INACTIVE | ACTIVE | PTDI-$STAP_0$-$STAP_2$-PTDO | 0 | 1 | 0 |
| 0 | 0 | 0 | 0 | 0 | 1 | | ACTIVE | ACTIVE | INACTIVE | PTDI-$STAP_1$-$STAP_2$-PTDO | 0 | 0 | 1 |
| 0 | 0 | 0 | 0 | 0 | 0 | | ACTIVE | ACTIVE | ACTIVE | PTDI-$STAP_0$-$STAP_1$-$STAP_2$-PTDO | 0 | 0 | 0 |
| 0 | 0 | 1 | 1 | 1 | 1 | | INACTIVE | INACTIVE | INACTIVE | NONE | 1 | 1 | 1 |
| 0 | 0 | 1 | 1 | 1 | 0 | | INACTIVE | INACTIVE | ACTIVE | PTDI-$STAP_0$-CTDO | 1 | 1 | 0 |
| 0 | 0 | 1 | 1 | 0 | 1 | | INACTIVE | ACTIVE | INACTIVE | PTDI-$STAP_1$-CTDO | 1 | 0 | 1 |
| 0 | 0 | 1 | 1 | 0 | 0 | | INACTIVE | ACTIVE | ACTIVE | PTDI-$STAP_0$-$STAP_1$-CTDO | 1 | 0 | 0 |
| 0 | 0 | 1 | 0 | 1 | 1 | | ACTIVE | INACTIVE | INACTIVE | PTDI-$STAP_2$-CTDO | 0 | 1 | 1 |
| 0 | 0 | 1 | 0 | 1 | 0 | | ACTIVE | INACTIVE | ACTIVE | PTDI-$STAP_0$-$STAP_2$-CTDO | 0 | 1 | 0 |
| 0 | 0 | 1 | 0 | 0 | 1 | | ACTIVE | ACTIVE | INACTIVE | PTDI-$STAP_1$-$STAP_2$-CTDO | 0 | 0 | 1 |
| 0 | 0 | 1 | 0 | 0 | 0 | | ACTIVE | ACTIVE | ACTIVE | PTDI-$STAP_0$-$STAP_1$-$STAP_2$-CTDO | 0 | 0 | 0 |

FIG. 42

| BYP | | | | | | STAP CONFIGURATION | | | SCAN-PATH | $\overline{CON}_2$ | $\overline{CON}_1$ | $\overline{CON}_0$ |
|---|---|---|---|---|---|---|---|---|---|---|---|---|
| 5 | 4 | 3 | 2 | 1 | 0 | STAP$_2$ | STAP$_1$ | STAP$_0$ | | | | |
| 0 | 1 | 0 | 1 | 1 | 0 | INACTIVE | INACTIVE | INACTIVE | NONE | 1 | 1 | 1 |
| 0 | 1 | 0 | 1 | 1 | 1 | INACTIVE | INACTIVE | ACTIVE | CTDI-STAP$_0$-PTDO | 1 | 1 | 0 |
| 0 | 1 | 0 | 1 | 0 | 0 | INACTIVE | ACTIVE | INACTIVE | CTDI-STAP$_1$-PTDO | 1 | 0 | 1 |
| 0 | 1 | 0 | 1 | 0 | 1 | INACTIVE | ACTIVE | ACTIVE | CTDI-STAP$_0$-STAP$_1$-PTDO | 1 | 0 | 0 |
| 0 | 1 | 0 | 0 | 1 | 0 | ACTIVE | INACTIVE | INACTIVE | CTDI-STAP$_2$-PTDO | 0 | 1 | 1 |
| 0 | 1 | 0 | 0 | 1 | 1 | ACTIVE | INACTIVE | ACTIVE | CTDI-STAP$_0$-STAP$_2$-PTDO | 0 | 1 | 0 |
| 0 | 1 | 0 | 0 | 0 | 0 | ACTIVE | ACTIVE | INACTIVE | CTDI-STAP$_1$-STAP$_2$-PTDO | 0 | 0 | 1 |
| 0 | 1 | 0 | 0 | 0 | 1 | ACTIVE | ACTIVE | ACTIVE | CTDI-STAP$_0$-STAP$_1$-STAP$_2$-PTDO | 0 | 0 | 0 |
| 0 | 1 | 1 | 1 | 1 | 0 | INACTIVE | INACTIVE | INACTIVE | CTDI-CTDO | 1 | 1 | 1 |
| 0 | 1 | 1 | 1 | 1 | 1 | INACTIVE | INACTIVE | ACTIVE | CTDI-STAP$_0$-CTDO | 1 | 1 | 0 |
| 0 | 1 | 1 | 1 | 0 | 0 | INACTIVE | ACTIVE | INACTIVE | CTDI-STAP$_1$-CTDO | 1 | 0 | 1 |
| 0 | 1 | 1 | 1 | 0 | 1 | INACTIVE | ACTIVE | ACTIVE | CTDI-STAP$_0$-STAP$_1$-CTDO | 1 | 0 | 0 |
| 0 | 1 | 1 | 0 | 1 | 0 | ACTIVE | INACTIVE | INACTIVE | CTDI-STAP$_2$-CTDO | 0 | 1 | 1 |
| 0 | 1 | 1 | 0 | 1 | 1 | ACTIVE | INACTIVE | ACTIVE | CTDI-STAP$_0$-STAP$_2$-CTDO | 0 | 1 | 0 |
| 0 | 1 | 1 | 0 | 0 | 0 | ACTIVE | ACTIVE | INACTIVE | CTDI-STAP$_1$-STAP$_2$-CTDO | 0 | 0 | 1 |
| 0 | 1 | 1 | 0 | 0 | 1 | ACTIVE | ACTIVE | ACTIVE | CTDI-STAP$_0$-STAP$_1$-STAP$_2$-CTDO | 0 | 0 | 0 |
| 1 | X | X | X | X | X | | | | AS REQUESTED BY LASP PROTOCOL | | | |

US 6,968,408 B2

LINKING ADDRESSABLE SHADOW PORT AND PROTOCOL FOR SERIAL BUS NETWORKS

This application claims the benefit of U.S. patent application Ser. No. 60/401,908 filed Aug. 8, 2002.

FIELD OF THE INVENTION

This invention relates generally to the use of serial buses to communicate between devices, systems, boards or networks, and in particular to serial backplane buses. The invention is applicable to any environment where a serial communication bus is or may be used, including circuit boards, backplanes, integrated circuits, and systems.

BACKGROUND OF THE INVENTION

IEEE standard 1149.1 (JTAG) provides boundary scan architecture and a serial test bus for integrated (ICs). Multiple ICs may be connected together on the test bus to allow accessing all ICs together during board level testing. Boards equipped with these JTAG ICs can be connected at the backplane level using two fundamental access schemes. The first scheme is to serially daisy-chain boards together to allow all boards to be accessed simultaneously. The second scheme is to provide each board with an addressable interface such that boards may be accessed individually. The first scheme suffers from the disadvantage that if one board is removed from the backplane, the access to other boards is disabled. The second scheme overcomes this problem by using an addressable scheme to access remaining boards in the backplane. Examples of the second scheme are described in detail in U.S. Pat. No. 6,363,443, which patent is incorporated herein by reference.

Some boards are preferably designed by partitioning subsets of ICs onto individual scan paths. This partitioning allows accessing subset groups of ICs separately, which offers several advantages. One advantage is that ICs that are capable of being accessed at higher JTAG test bus clock rates can be included in one group, while ICs that operate at slower test bus clock rates may be placed in another group. Thus test bus speed binning is possible. Another advantage in partitioning ICs onto separate scan paths is that it allows accessing a first scan path group to initiate a self test operation, then, while that group operates the self test, accessing another scan path group to start testing of that IC group. Still another advantage is that some ICs may include emulation and debug features that are accessible by the JTAG test bus. Being able to place these types of ICs in a group separate from other ICs leads to improvements in execution efficiency of JTAG based debug and emulation operations.

The Addressable Shadow Port (ASP) described in U.S. Pat. No. 6,363,443 uses a Shadow Protocol that is transmitted transparently over the JTAG test bus. At the backplane level, the Shadow Protocol is used to send an address over the backplane test bus to enable one of a plurality of board resident ASPs. Once enabled, the ASP of the addressed board allows the backplane JTAG test bus to communicate to the ICs of the addressed board. If the board has multiple scan paths to allow accessing ICs in the above mentioned grouping style, an ASP and an associate address would be required for each scan path group. Thus a board with multiple scan paths would require multiple ASPs each with a distinct address.

Linker circuits are known which allow augmentation of a system's primary scan path with secondary scan paths which can be individually selected for inclusion in the primary scan path. These are configured by loading a register with instructions by placing it in the scan path.

SUMMARY OF THE INVENTION

It is a general object of the present invention to provide an improved method and circuits for communicating with devices on a serial bus.

This and other object and features are achieved, in accordance with a first aspect of the invention by a system for communicating between devices via a serial bus utilizing an addressable shadow port (ASP) circuit selected by sending a broadcast message over the serial bus containing an address of an ASP circuit to be selected. A plurality of output ports are provided on the ASP circuit, each output port operable to connect a serial bus slave to the serial bus. A first configuration code in the broadcast message determines a route for data signals through the ASP circuit, whereby the serial path will include one, some or all serial bus slaves coupled to the output ports of the ASP circuit.

A second aspect of the invention includes a system for communicating between devices via a serial bus utilizing an addressable shadow part (ASP) circuit selected by sending a broadcast message over the serial bus containing an address of an ASP circuit to be selected. A cascade input line and cascade output line are provided on the ASP circuit, the cascade input line operable to receive a data signal from another ASP circuit, the cascade output line operable to transmit a data signal to another ASP circuit. A second configuration code in the broadcast message determines if the ASP circuit operates as a stand alone circuit, or if it receives data on the cascade input line and if transmits data via the cascade output line.

A third aspect of the invention is provided by a method for communicating between devices via a serial bus utilizing an addressable shadow port (ASP) circuit having a plurality of output ports. A broadcast message is sent over the serial bus, the broadcast message comprising an address for an ASP circuit to be selected and a first configuration code. The first configuration code determines a route for data signals through the selected ASP circuit. The selected ASP circuit is configured so that the data path will include none, some or all serial bus slaves coupled to one of the plurality of output ports.

A fourth aspect of the invention includes a method for communicating between devices via a serial bus utilizing an addressable shadow port (ASP) circuit having a test data input line and a cascade input line and a test data output line and a cascade output line. A broadcast message is sent over the serial bus, the broadcast message comprising an address for an ASP circuit to be selected and a second configuration code. The second configuration code, determines if an input signal will be received on the test data input line or on the cascade input line and whether an output signal will be transmitted on the test data output line or on the cascade output line. The selected ASP circuit is configured to receive data on the test data input line or the cascade input line and transmit data on the test data output line or the cascade output line according to the second configuration code.

A fifth aspect of the invention comprises an addressable connection system. A master device communicates data. At least one slave device is provided to which data may be received from the master device. An addressable connection circuit is coupled between the master device and the slave device and responds to a broadcast message identifying a selected connection circuit by its address. The connection circuit has a plurality of output ports, one of the plurality of output ports being coupled to the at least one slave device. An output configuration circuit in the connection circuit is responsive to a first configuration code in the broadcast message for configuring the plurality of output ports so that a data path with the master device will include a slave device coupled to none, some or all of the output ports.

A sixth aspect of the invention is provided by an addressable connection system. A master device communicates data. At least one slave device is provided to which data may be received from the master device. An addressable connection circuit is coupled between the master device and the slave device and responds to a broadcast message identifying a selected connection circuit by its address. The connection circuit has a cascade input line and a cascade output line, the cascade input line operable to receive data from another addressable connection circuit, the cascade output line operable to transmit data to another addressable connection circuit and a test data input line and test data output line each coupled to the serial bus. A cascade configuration circuit in the connection circuit is responsive to a second configuration code in the broadcast message for configuring the connection circuit input line and output line to receive input data on a test data input line or cascade input line and transmits output data on a test data output line or cascade output line.

A seventh aspect of the invention comprises, a system for communicating between device via a serial bus utilizing an addressable shadow port (ASP) circuit selected by sending a broadcast message over the serial bus containing an address of an ASP circuit to be selected. A group of cascaded ASP circuits comprise a first ASP circuit configured to receive input data on a test data input line and transmit output data on a cascade output line. A last ASP circuit is configured to receive input data on a cascade input line and transmit output data on a test data output line, wherein the last ASP circuit determines its position in the group of cascaded ASP circuits from position data sent in the broadcast message and determines that it is the circuit to send an acknowledgement message to a source of the broadcast message.

An eighth aspect of the invention includes a method for communicating between devices via a serial bus utilizing a plurality of addressable shadow ports (ASPs). A broadcast message is sent from a message source to all devices on the serial bus and contains an address of an ASP circuit to be selected and at least one configuration message for configuring ASP circuits on the serial bus for a cascaded connection. Configuring ASP circuits on the bus as at least a first ASP circuit and a last ASP circuit, the last ASP circuit determining its position from position data included in the configuration message and determining that it is the circuit to send the broadcast message back to the message source as an acknowledgement message.

A ninth aspect of the invention comprises a system for communicating between devices via a serial bus utilizing an addressable shadow port (ASP) circuit selected by sending a broadcast message over the serial bus containing an address of an ASP circuit to be selected. An ASP circuit comprises a plurality of output ports, each output port being operable to connect a serial bus slave to the serial bus. A configuration circuit in the ASP circuit is responsive to a first configuration code in the broadcast message for determining a route for data signals through the ASP circuit, whereby none, some or all serial bus slaves coupled to the output ports are in the path. A bypass input on the ASP circuit receives a hardwired bypass code that determines the configuration of the ASP circuit and overrules the configuration set by the configuration code in the broadcast message.

BRIEF DESCRIPTION OF DRAWINGS

FIG. 39–FIG. 40 tabulate the secondary TAPs connections and data path using configuration field of a LASP;

FIG. 41–FIG. 42 tabulate the secondary TAPs connections and data path using bypass inputs;

DETAILED DESCRIPTION OF THE INVENTION

Figure 1:
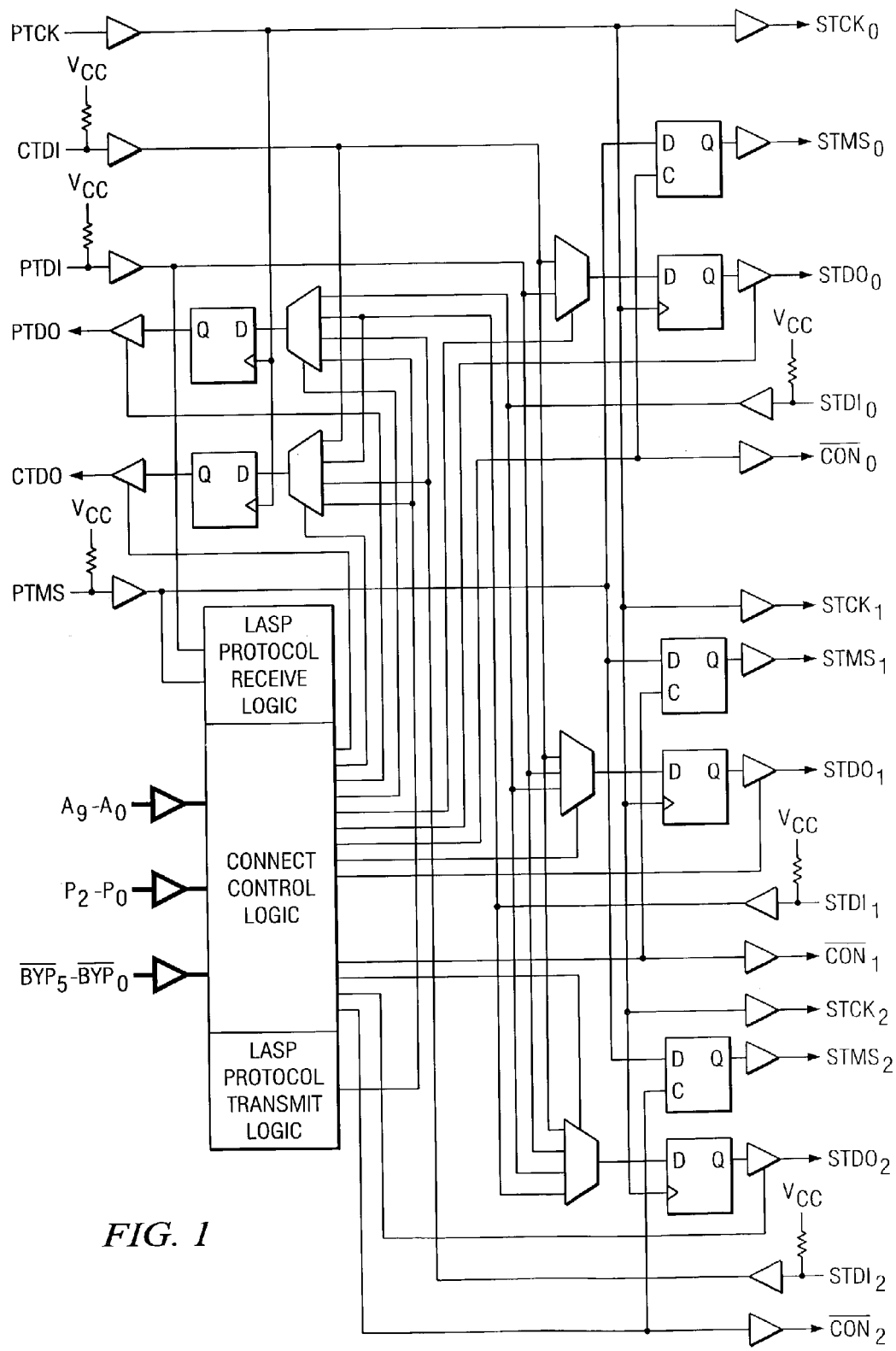
FIG. 1 depicts a block level diagram of the circuitry required to implement the LASP circuit of the invention.

Within this specification, the following abbreviations are used hereafter:

TAP indicates a test access port, the standard hardware interface of devices coupled to the 1149.1 bus.

TMS indicates the Test Mode Select line, the control line of the 1149.1 bus.

TDO indicates the Test Data Output line, one of the lines the 1149.1 bus transfers serial data on.

TDI indicates the Test Data Input line, one of the lines the 1149.1 bus transfers data on.

TCK indicates the Test Clock line, the common clock line used by all of the devices coupled to the 1149.1 serial bus to synchronize transfers between devices.

A serial bus slave is a circuit or device that can be enabled and communicated to by a serial bus master via the serial bus network. A serial bus slave as used in this application refers to any well-defined logic block or circuitry having input and output circuitry operable to allow it to be interfaced onto a serial bus. For simplicity, this application treats serial bus slaves as being printed circuit boards, comprised of multiple ICs that are plugged into a system backplane. However, it should be understood that the invention could be used in applications which define serial bus slaves as being: (1) sub in an IC, (2) ICs on a common substrate (i.e. multi-chip modules), (3) ICs on a printed circuit board, (3) boards plugged into a system backplane, (4) backplanes in a subsystem (5) subsystems in a system, or (6) systems connected to other systems. Throughout the remainder of this application, the serial bus slave will be referred to as an SBS.

A serial bus master is a circuit or device that can output the necessary control signals to enable communications with a serial bus slave via the serial bus network. Throughout the remainder of this application, the serial bus master will be referred to as an SBM.

A serial bus protocol and circuitry is defined herein that provides an addressable method of coupling the SBM up to one of many boards in a backplane, via the 1149.1 serial bus network. The circuit and related protocol is referred to herein as a Linking Addressable Shadow Port (LASP). The term "shadow" indicates the nature of the protocol and circuitry, since it exists in the background of the serial bus it is associated with. The term "linking" indicates its capability of linking multiple SBSs and cascading multiple LASPs to expand the daisy chain. The LASP protocol is designed to coexist and be fully compatible with the Addressable shadow port (ASP) protocol disclosed in the U.S. Pat. No. 6,363,443 entitled Addressable shadow port and protocol for serial bus networks, issued Mar. 26, 2002 to Whetsel. While the 1149.1 serial bus is in operation, the LASP is inactive and does not interfere with the operation of the bus. The LASP can be enabled when the 1149.1 backplane serial bus is in either the IDLE or RESET states. The LASP is enabled when it is required to connect the SBM up to one of the boards in the backplane. After the LASP has been used to connect a board to the SBM, it is disabled and is transparent to the normal operation of the 1149.1 serial bus or whatever bus it is associated with. Since the invention operates via its own unique protocol that is not part of the 1149.1 protocol, it provides a solution to the extension of the 1149.1 standard to the backplane environment without modification of the 1149.1 standard or the need for additional hardware translation circuitry.

FIG. 1 is a circuit diagram showing an implementation of the LASP of the present invention. The LASP circuit consists of a primary TAP for interfacing to the backplane 1149.1 serial bus signals. (PTDI, PTMS, PTCK, PTDO), and secondary TAPs for interfacing to the board level 1149.1 serial bus signals. Each secondary TAP interfaces with signals (STDI, STMS, STCK, STDO). This embodiment utilizes a LASP with one Primary TAP and three Secondary TAPs. Conceptually, the LASP is a simple switch that can be used to directly connect a set of primary TAP signals to a set of secondary TAP signals; for example, to interface backplane TAP signals to a board-level TAP. The LASP provides all signal buffering that might be required at these two interfaces. Primary to Secondary TAPs connections can be configured using a LASP protocol or protocol bypass inputs ($BYP_5$–$BYP_0$).

Most operations of the LASP are synchronous to the PTCK input. PTCK is always buffered directly onto the ($STCK_2$–$STCK_0$) outputs. PTDO can be configured to receive ($STDI_2$–$STDI_0$). ($STDO_2$–$STDO_0$) can be configured to receive either of PTDI, ($STDI_2$–$STDI_0$), or Cascade test data input (CTDI). Cascade test data output (CTDO) can be configured to receive either of ($STDI_2$–$STDI_0$), or (CTDI). CTDI input and CTDO output facilitate cascading multiple LASPs, which is explained below. Similarly ($STMS_2$–$STMS_0$) outputs can be configured to receive PTMS input. When any secondary TAP is disconnected, its respective STDO is at high impedance. Upon disconnect of the secondary TAP, corresponding STMS holds its last low or high level, allowing the secondary TAP to be held in its last stable state.

The address inputs to the LASP are used to identify the board on which the LASP is mounted. The position inputs to the LASP are used to identify the position of the LASP within a cascade chain. This embodiment applies to address inputs of 10 bits (A9–A0) and position inputs of 3 bits (P2–P0).

Logic blocks for LASP protocol receive and LASP protocol transmit are responsible for receipt of select protocol and transmission of acknowledge protocol, respectively. The connect-control logic block is responsible for monitoring 1149.1 backplane serial bus state, and address matching. Based on the LASP Protocol result or protocol bypass ($BYP_5$–$BYP_0$) inputs, connect control logic block also configures the connection of the primary to secondary TAPs. In conjunction it also sets the states of $CON_2$–$CON_1$ outputs.

During a select protocol, the LASP protocol receive logic receives a PTDI input sequence from the SBM. If the address and position received during the select protocol transmission matches the board address inputs and position inputs to the connect control logic block, the connect control logic block configures the primary to secondary TAPs connections based on the configuration received during select protocol transmission. LASP protocol transmit logic block then transmits an acknowledge protocol, containing the board address, position and configuration back to the SBM via the PTDO output. In response to receiving the acknowledge protocol, the SBM outputs the 1149.1 serial bus protocol onto the backplane to serially input data to and output data from the selected board, via the connection made between the primary and secondary TAPs of the LASP by the connect control logic block.

If the address received during the select protocol transmission does not match the board address input, the connect control logic block does not make a connection between the primary and secondary TAPs, and does not transmit an acknowledge protocol to the SBM. In response to not receiving the acknowledge protocol, the SBM detects that the board address does not exist or is unable to respond and does not attempt to transfer serial data to the board using the 1149.1 serial bus protocol.

Figure 6A:
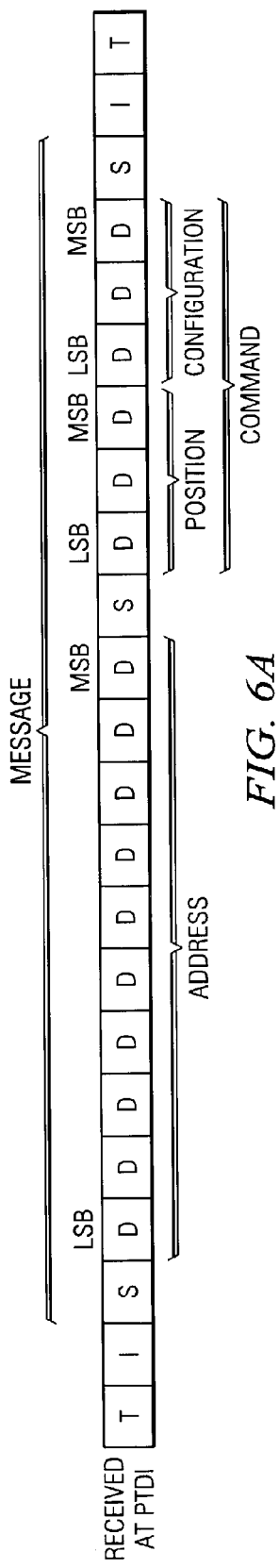
FIG. 6 depicts the select and acknowledge protocols of the invention.
Figure 6B:
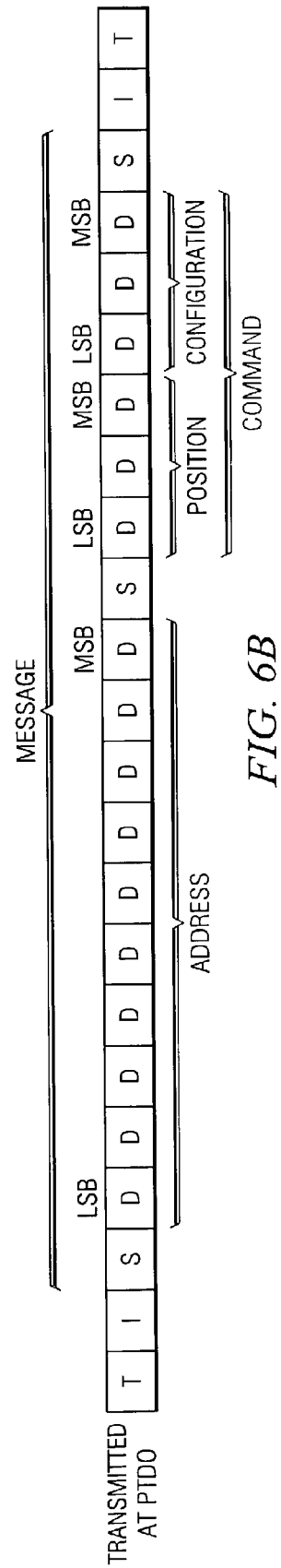

In order for the SBM and LASP to communicate the select and acknowledge protocols without using the 1149.1's TMS control signal, an encoding scheme similar to the one developed for ASP is used which allows control and data information to be transmitted together on a single wiring channel. In FIG. 6, the encoding scheme allows the SBM to transmit the select protocol from its TDO output to the LASP's PTDI inputs. Likewise, the encoding scheme allows the selected LASP to transmit the acknowledge protocol from its PTDO output to the SBM's TDI input. In both transactions, the protocols are transmitted over a single backplane wiring channel. The select protocol passes through the wiring channel between the SBM's TDO output and the LASP's PTDI inputs. The acknowledge protocol passes through the wiring channel between the selected LASP's PTDO output and the SBM's TDI input. This encoding scheme is extended to allow the cascading of multiple LASP. When multiple LASPs are cascaded, the encoding scheme allows the SBM to transmit the select protocol from its TDO output to the PTDI inputs of all the cascaded LASPs. Likewise, the encoding scheme allows the last LASP in the selected cascade chain to transmit the acknowledge protocol from its PTDO output to the SBM's TDI input.

Both the select and acknowledge protocols require a method of transmitting control to indicate; (1) an idle condition, (2) a start data transfer condition, and (3) a stop data transfer condition. In addition, both protocols require a method of transmitting data during the interval between the start and stop data transfer conditions.

Figure 2:
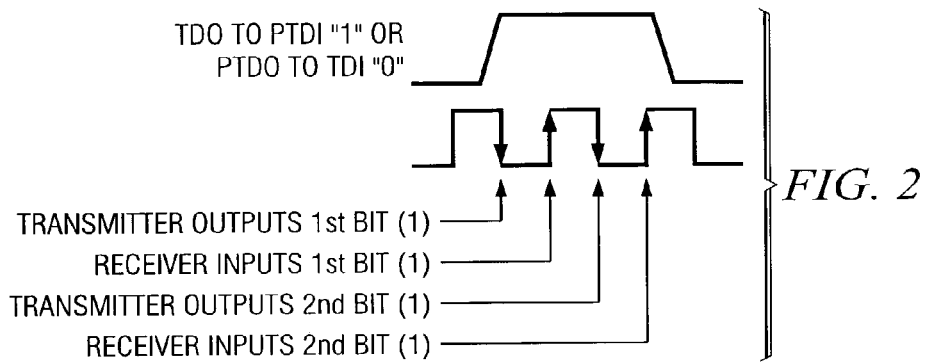
FIG. 2 depicts the timing of a transfer of an IDLE bit-pair of the protocol of the invention.
Figure 3:
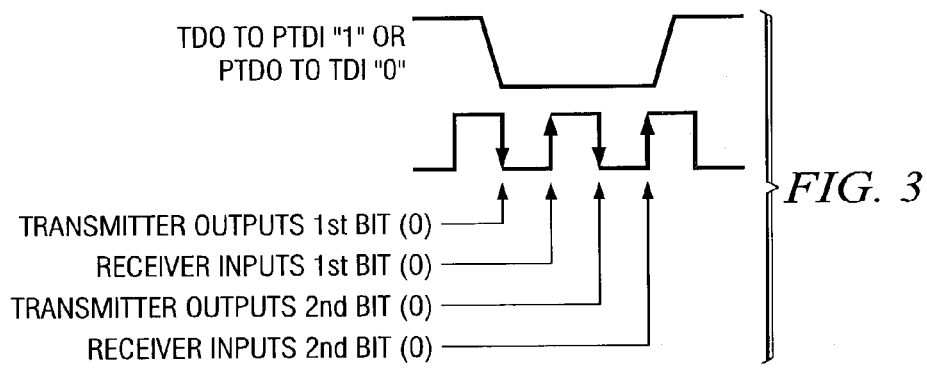
FIG. 3 depicts the timing of a transfer of a SELECT bit-pair of the protocol of the invention.
Figure 4:
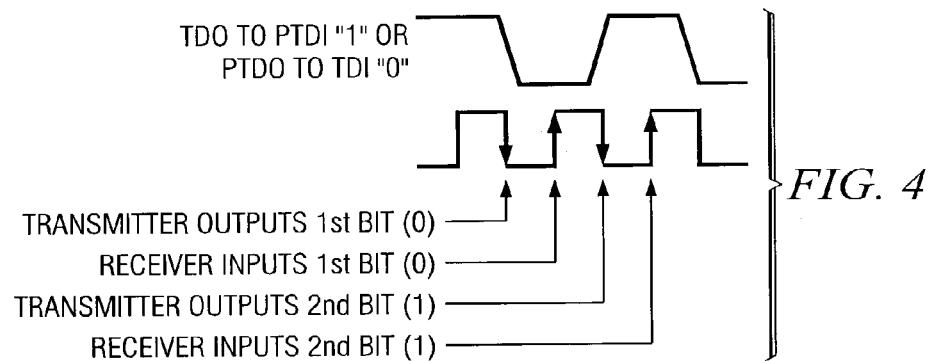
FIG. 4 depicts the timing of a transfer of a logic 1 data bit-pair of the protocol of the invention.
Figure 5:
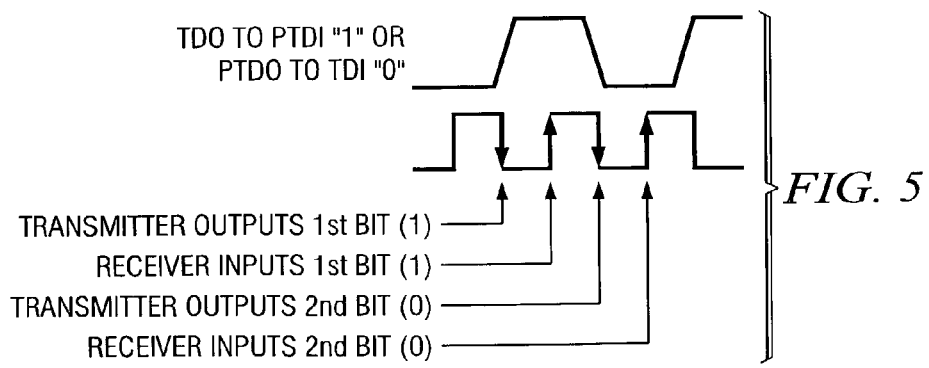
FIG. 5 depicts the timing of a transfer of a logic 0 data bit-pair of the protocol of the invention.

To achieve the transmission of both control and data on a single wire, a LASP uses the bit-pair encoding scheme used by ASP. This allows a LASP to coexist and be fully compatible with the ASP. The encoded bit-pairs are transferred between the SBM and LASP during select and acknowledge protocols synchronous to the backplane TCK signal. Two TCKs are required to transmit each encoded bit-pair. FIGS. 2–5 depict the bit-pair encoding. FIG. 2 depicts an Idle bit-pair, FIG. 3 depicts a Select bit-pair, FIG. 4 depicts a logic 1 bit-pair, and FIG. 5 depicts a logic 0 bit-pair, respectively.

In FIG. 2, an encoded control signal, called Idle (I), is identified by the transfer of two successive logic one bits from a transmitter to a receiver. During the select protocol, the SBM (transmitter) outputs the Idle bit-pair on its TDO output to the LASP's (receivers) PTDI inputs. During the acknowledge protocol, the selected LASP (transmitter) outputs the Idle bit-pair on its PTDO output to the SBM's (receiver) TDI input. In the timing diagram of FIG. 2, it is seen that Idle bit-pairs are output from the transmitter on the falling edge of the TCK, and are input to the receiver on the rising edge of the TCK.

In FIG. 3, an encoded control signal, called Select (S), is identified by the transfer of two successive logic zero bits from a transmitter to a receiver. During the select protocol, the SBM (transmitter) outputs the Select bit-pair on its TDO output to the LASP's (receivers) PTDI inputs. During the acknowledge protocol, the selected ASP (transmitter) outputs the Select bit pair on its PTDO output to the SBM's (receiver) TDI input. In the timing diagram of FIG. 3, it is seen that Select bit-pairs are output from the transmitter on the falling edge of the TCK, and are input to the receiver on the rising edge of the TCK.

In FIG. 4, an encoded logic one signal, called Data (D), is identified by the transfer of a logic zero bit followed by a logic one bit from a transmitter to a receiver. During the select protocol, the SBM (transmitter) outputs the logic one Data bit-pair on its TDO output to the LASP's (receivers) PTDI inputs. During the acknowledge protocol, the selected LASP (transmitter) outputs the logic one Data bit-pair on its PTDO output to the SBM's (receiver) TDI input. In the timing diagram of FIG. 4, logic one Data bit-pairs are shown output from the transmitter on the falling edge of the TCK, and are input to the receiver on the rising edge of the TCK.

In FIG. 5, an encoded logic zero signal, called Data (D), is identified by the transfer of a logic one bit followed by a logic zero bit from a transmitter to a receiver. During the select protocol, the SBM (transmitter) outputs the logic zero Data bit-pair on its TDO output to the LASP's (receivers) PTDI inputs. During the acknowledge protocol, the selected LASP (transmitter) outputs the logic zero Data bit-pair on its PTDO output to the SBM's (receiver) TDI input. In the timing diagram of FIG. 5, logic zero Data bit-pairs are shown as output from the transmitter on the falling edge of the TCK, and are input to the receiver on the rising edge of the TCK.

Note that the definitions of a logic one DATA bit-pair represented by a 0 and 1 bit sequence and a logic zero DATA bit-pair represented by a 1 and 0 bit sequence could be reversed without departing from the invention. Also note that the rising edge and falling edge timing nature of the bit-pairs may be redefined as required in an application without departing from the invention.

The definitions of the Idle bit-pair represented by two successive 1's and the Select bit-pair represented by two successive 0's could be switched without departing from the invention. When the 1149.1 serial bus is in its RESET or IDLE state, the TDO output from the SBM and slave devices is disabled to a high logic level. While the 1149.1 serial bus is in the RESET or IDLE states, protocol can be output on the bus. Since both the select and acknowledge protocols start and stop by outputting IDLE bit-pairs, it makes sense that the Idle bit-pairs be of the same logic level as the disabled TDO outputs are in, i.e. a high logic level. Thus the definition shown for the Idle bit-pair, two success logic ones, enables a clean transition between the 1149.1's protocol and the present protocol. Unintentional entry into the LASP protocol is also avoided by the use of this definition of the Idle bit-pair.

FIG. 6 is an example of complete LASP protocol, and is composed of the receipt of a select protocol followed, if applicable, by the transmission of an acknowledge protocol. Both select and acknowledge protocols are composed of two fields (address and command) comprising a message. Select bit pairs frame each field at the beginning and end, and idle bit pairs frame the message at the beginning and end. The address is composed of 10 data bit pairs representing and selecting the LASP by matching it against address inputs (A9–A0). The command consists of two sub fields, namely position and configuration. Position identifies the physical position of the LASP in the cascaded chain and selects the LASP within cascaded group by matching it against address inputs (P2–P0). When the LASP is configured to stand alone, its inputs (P2–P0) are tied low. Configuration is used for configuring the primary to secondary TAPs connections of the LASP whose address and position matched. The "T" signals in the protocol sequences in FIG. 6 indicate tri-state conditions on the TDO output from the SBM and the PTDO output from the ASP. The tri-state conditions are placed on the TDO and PTDO outputs whenever the 1149.1 serial bus is idle in the RESET or IDLE state. When a T signal is shown in the protocol sequence, the logic level on the wiring channel will be a logic one due to pull-up resistors on the TDI and PTDI inputs connected to the PTDO and TDO outputs.

The LASP protocol takes advantage of this 1149.1 pull-up requirement by defining the Idle bit-pair to be two logic ones, so that when the protocol is idle, i.e. when no select or acknowledge protocols are being transmitted, the logic level it drives onto the bus is indistinguishable from the T signal logic level. Thus the Idle bit-pair encoding is necessary to making this technique transparent to the normal operation of the 1149.1 serial bus. In an alternative serial bus, where the inactive state of the bus drives the data wiring channels to a low logic level, it would be necessary to encode the Idle bit-pair as two logic zeros and the Select bit-pairs as two logic ones to enable this technique to operate transparently with that serial bus protocol.

Alternatively, configuration of primary to secondary TAPs connections can be achieved by assertion of a low level at the protocol bypass ($BYP_5$) input. The remaining protocol bypass ($BYP_4$–$BYP_0$) inputs are used for configuring the connection of secondary TAPs. This operation is asynchronous. This bypassing feature is especially useful in the board-test environment, since it allows the board-level automated test equipment (ATE) to treat the LASP as a simple transceiver. When the $BYP_5$ input is high, the LASP is free to respond to linking shadow protocols. Otherwise, when $BYP_5$ is low, LASP protocols are ignored.

Whether the secondary TAP's connected status is achieved by use of LASP protocol or by use of protocol bypass inputs, this status is indicated by a LOW level at the connect ($CON_2$–$CON_0$) outputs. Likewise, when the secondary TAP is disconnected from the primary TAP, the corresponding CON output is set HIGH.

All the possible ways that the secondary TAPs can be connected with the help of LASP Protocol or protocol bypass inputs are shown in FIG. 7–FIG. 38.

FIG. 7–FIG. 14 show the primary to secondary TAPs connections when the LASP is not cascaded with one or more LASPs. In this case when connecting the secondary TAPs using LASP protocol, the Position bits are "000" after the bit pairs received during select protocol are decoded. Inputs (P2–P0) are also set to LOW. When connecting the secondary TAPs using ($BYP_5$–$BYP_0$) inputs, $BYP_4$ and $BYP_3$ inputs are set to LOW. When ($BYP_2$–$BYP_0$) inputs are set to HIGH or the configuration bits received during select protocol are decoded as "111" then none of the secondary TAPs are connected.

Figure 7:
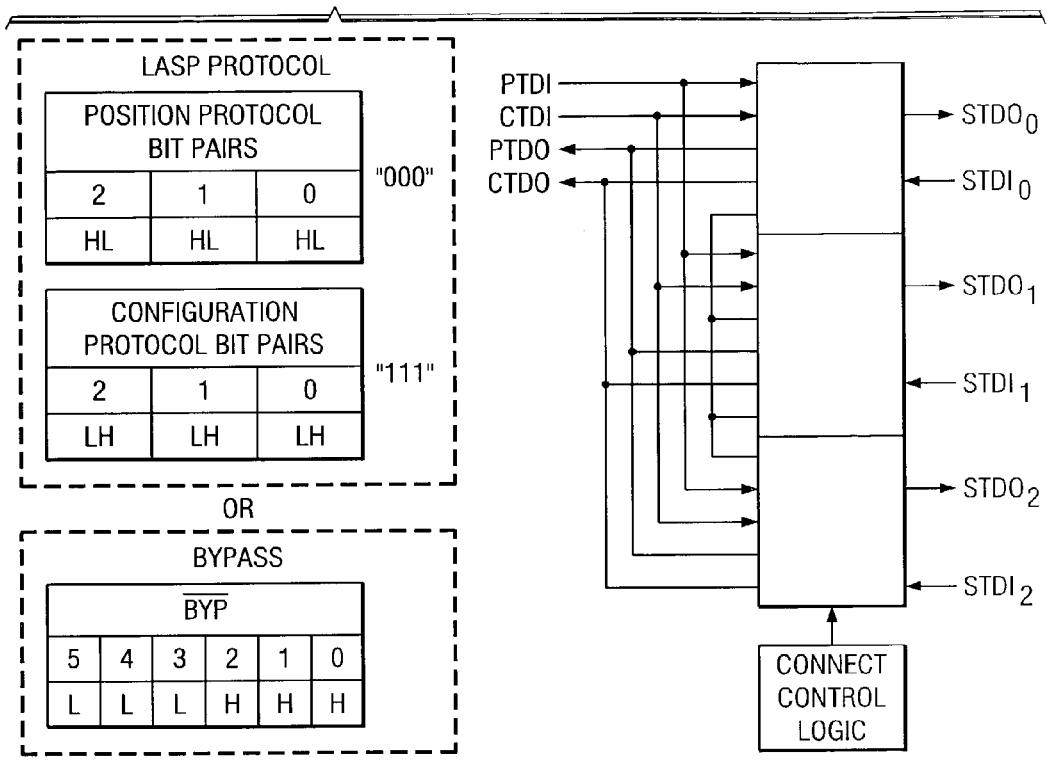
FIG. 7–FIG. 14 depict the primary to secondary TAPs connections when the LASP is not cascaded with one or more LASPs (Single LASP). It includes examples of command field of LASP protocol and protocol bypass inputs required for configuring the primary to secondary TAP connections.
Figure 8:
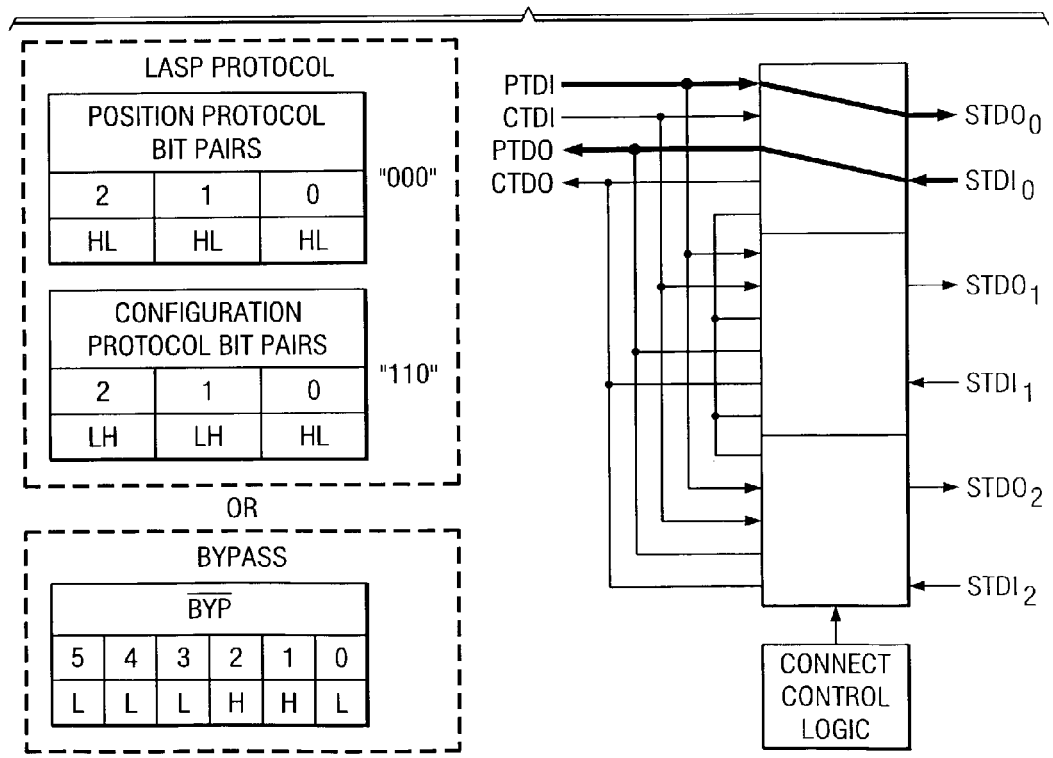
Figure 9:
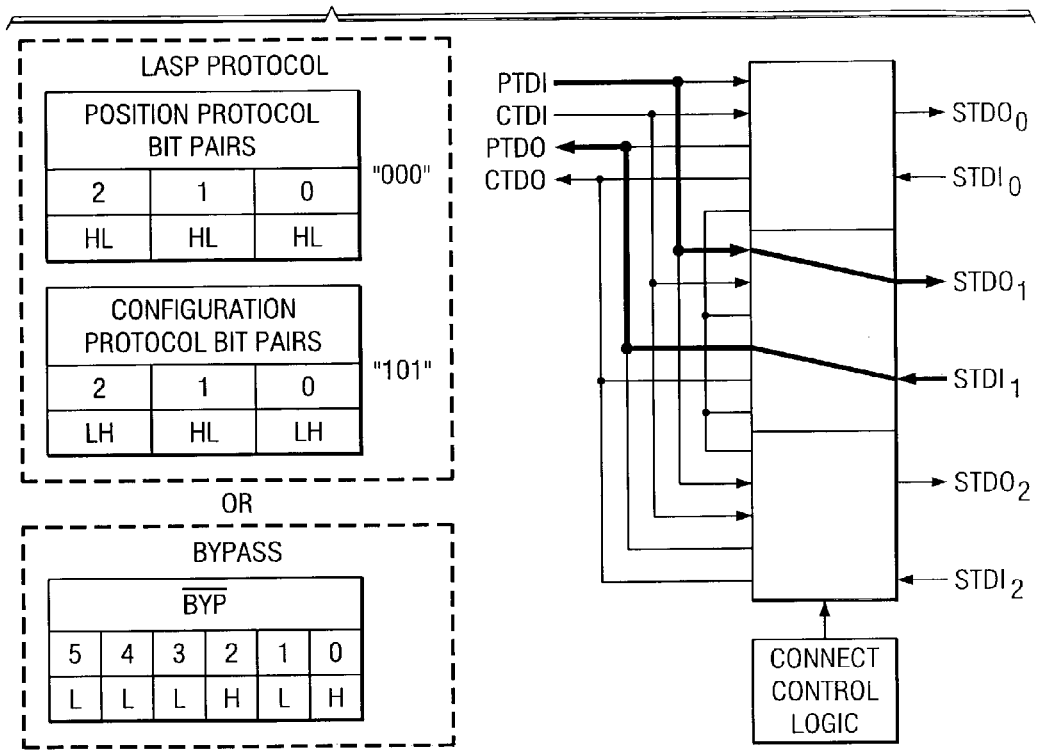
Figure 10:
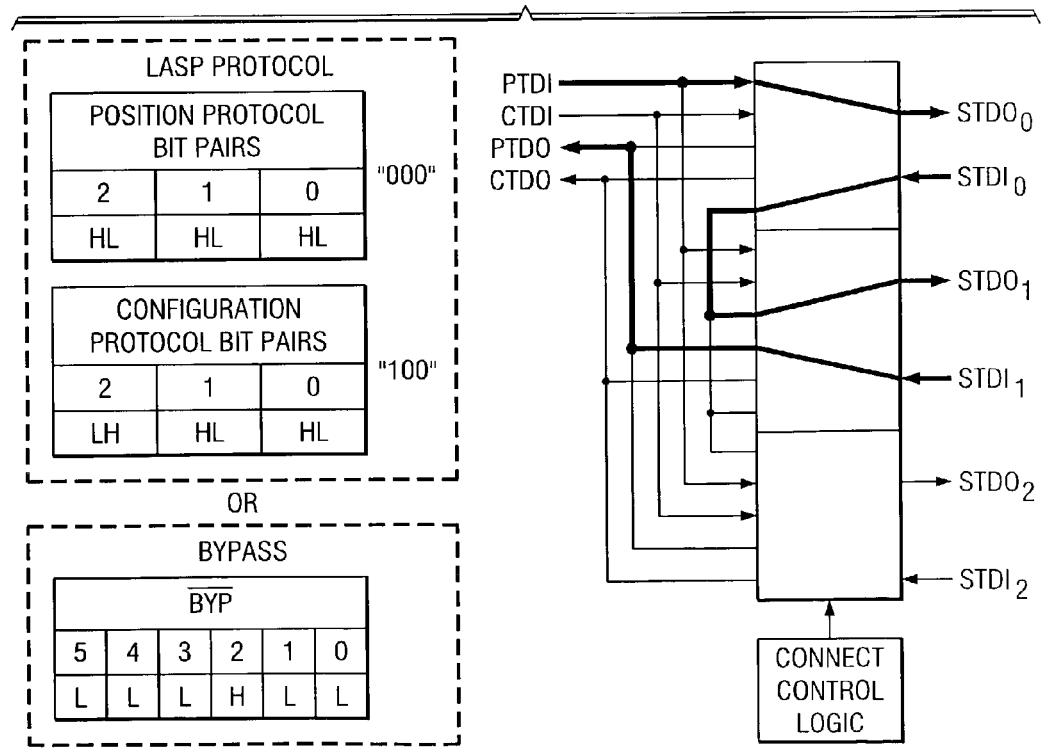
Figure 11:
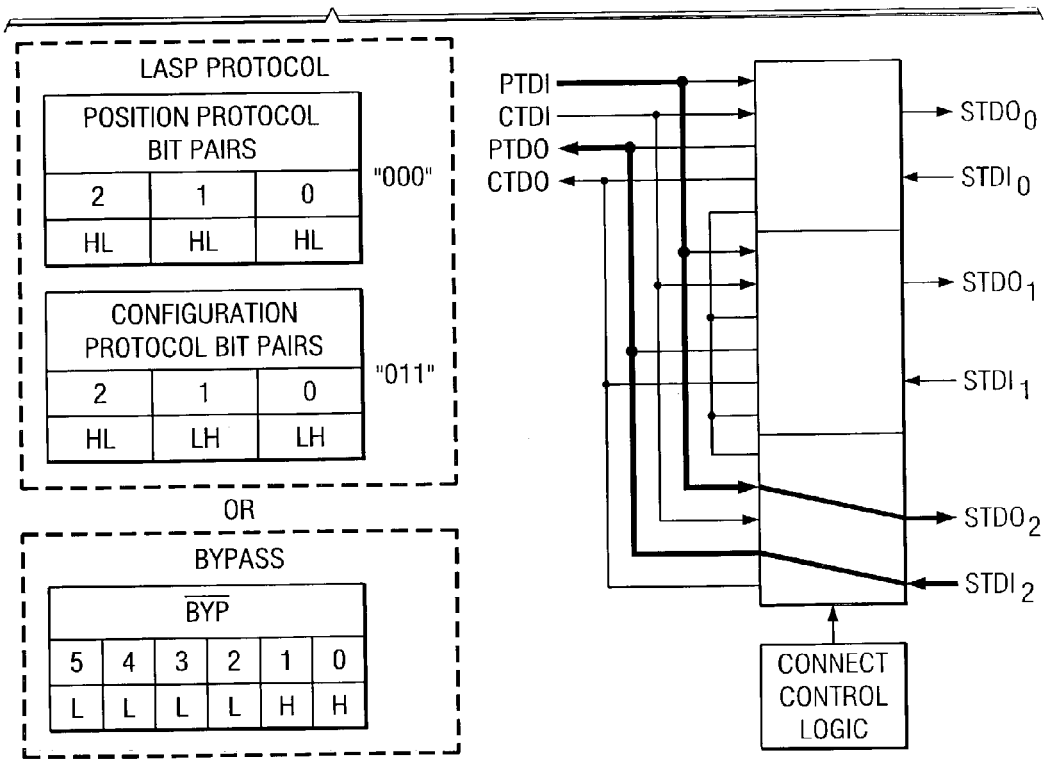
Figure 12:
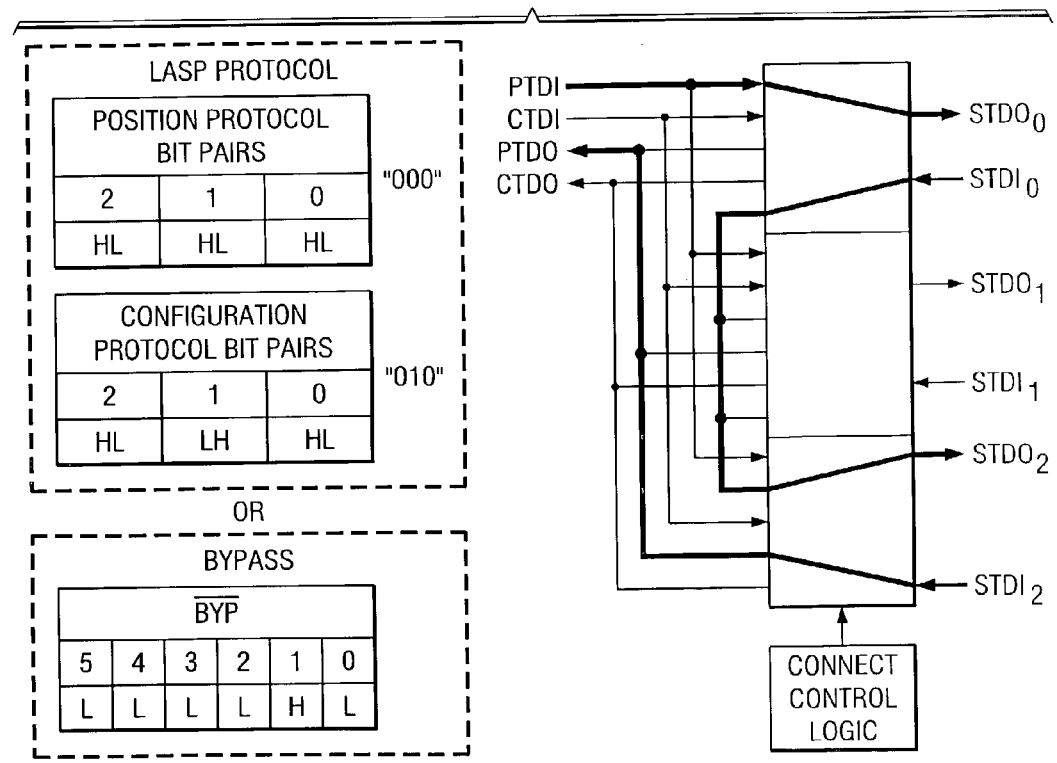
Figure 13:
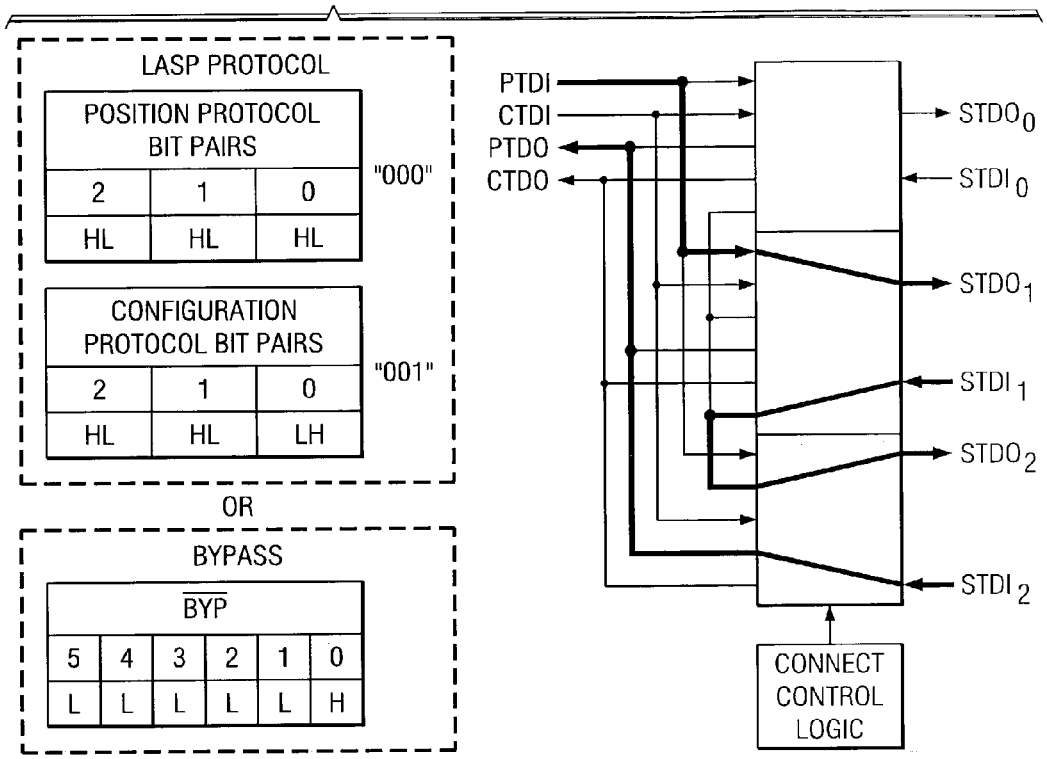
Figure 14:
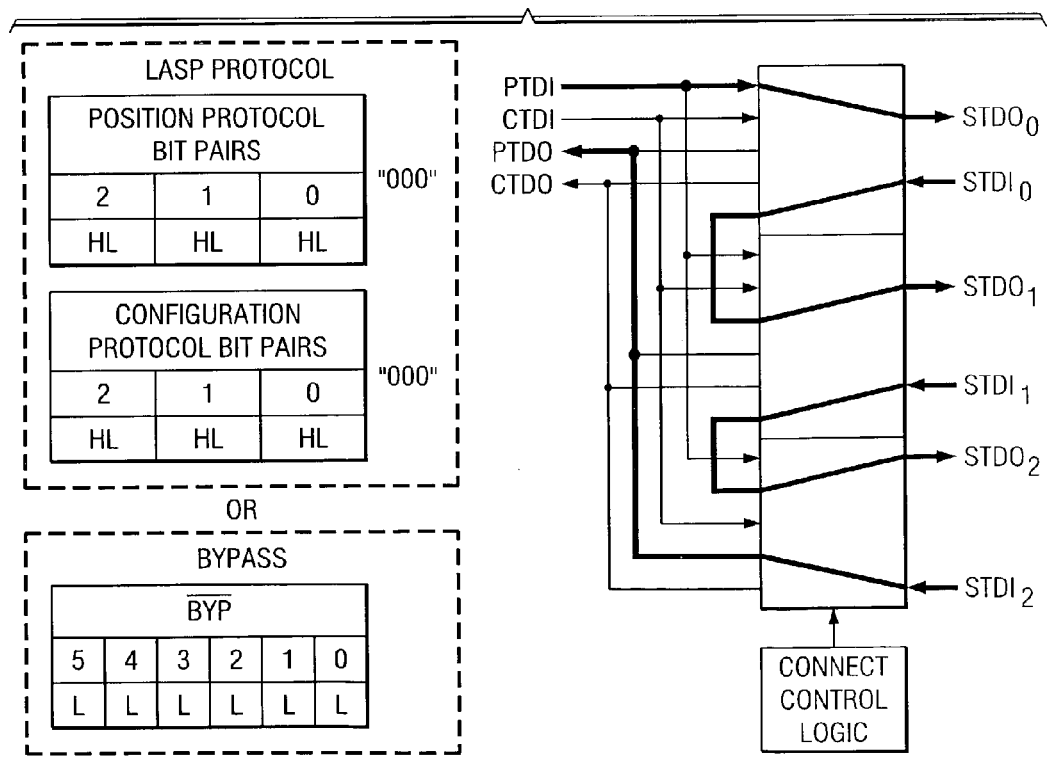

FIG. 7 shows a single (non-cascaded) LASP having all 3 TAPs turned OFF. FIG. 8 shows a single LASP having TAP 0 turned ON and illustrates the data flow to and from the SBS. FIG. 9 shows a single LASP having TAP 1 turned ON and illustrates via bolded lines the data flow to and from the SBS. FIG. 10 shows a single LASP having TAPs 0 and 1 turned ON and illustrates via bolded lines the data flow to and from the SBSs. FIG. 11 shows a single LASP having TAP 2 turned ON and illustrates via bolded lines the data flow to and from the SBS. FIG. 12 shows a single LASP having TAPs 0 and 2 turned ON and illustrates via bolded lines the data flow to and from the SBSs. FIG. 13 shows a single LASP having TAPs 1 and 2 turned ON and illustrates via bolded lines the data flow to and from the SBSs. FIG. 14 shows a single LASP having all 3 TAPs, 0, 1 and 2, turned ON and illustrates via bolded lines the data flow to and from the SBSs.

FIG. 15–FIG. 22 show the primary to secondary TAPs when the LASP is cascaded with one or more LASPs and is the first LASP in the cascade chain. An example of three LASP being cascaded is used in this embodiment. In this case when connecting the primary to secondary TAPs using LASP protocol, the Position bits are "000" after the bit pairs received during select protocol are decoded. When connecting the primary to secondary TAPs using ($BYP_5$–$BYP_0$) inputs, $BYP_4$ is set to LOW and $BYP_3$ is set to HIGH. When ($BYP_2$–$BYP_0$) inputs are set to HIGH or the configuration bits received during select protocol are decoded as "111" then none of the secondary TAPs are connected.

Figure 15:
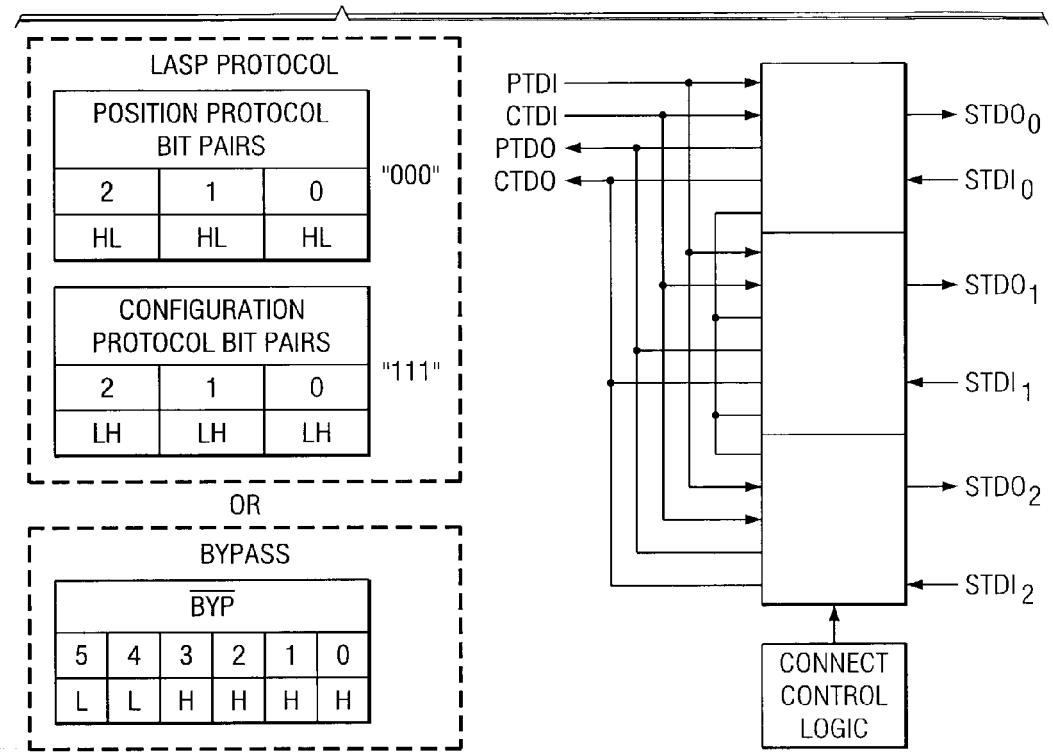
FIG. 15–FIG. 22 depict the primary to secondary TAPs connections when the LASP is cascaded with one or more LASPs and is first LASP in the cascade chain. It includes examples of command field of LASP protocol and protocol bypass inputs required for configuring the primary to secondary TAPs connections.
Figure 16:
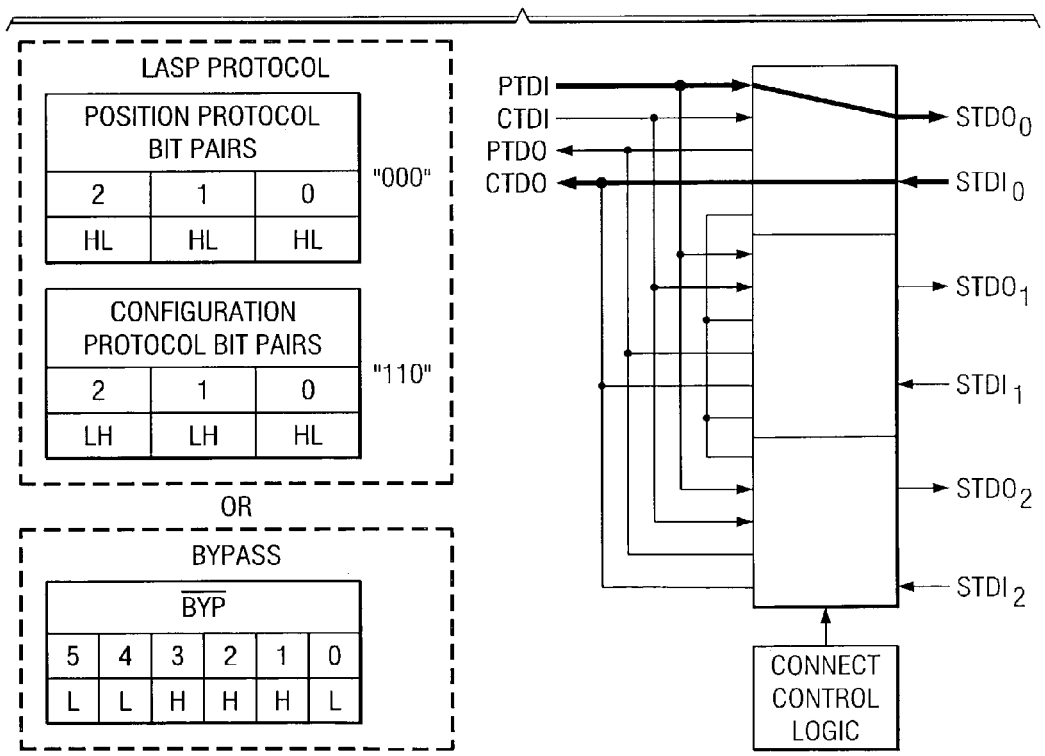
Figure 17:
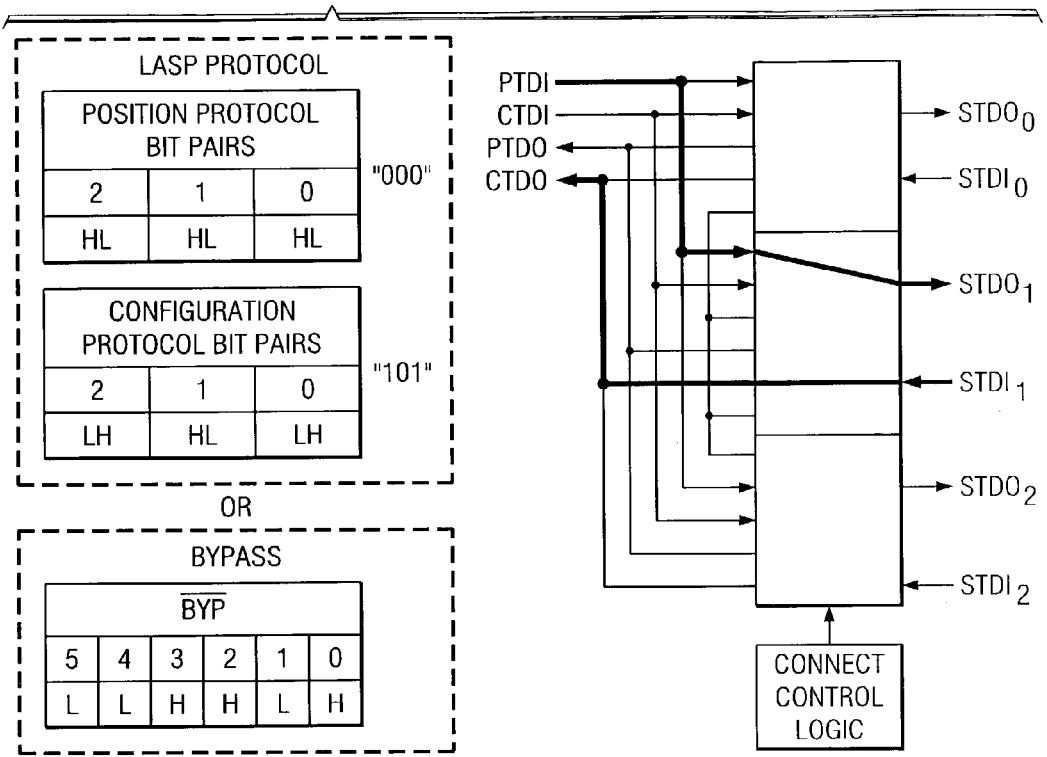
Figure 18:
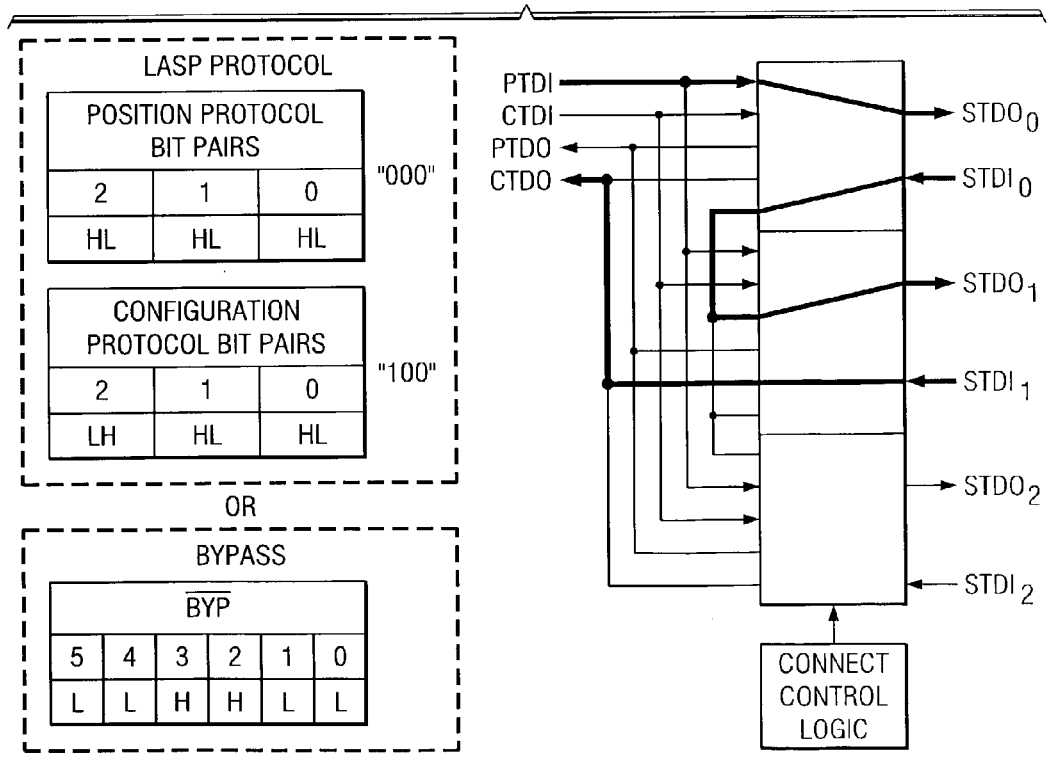
Figure 19:
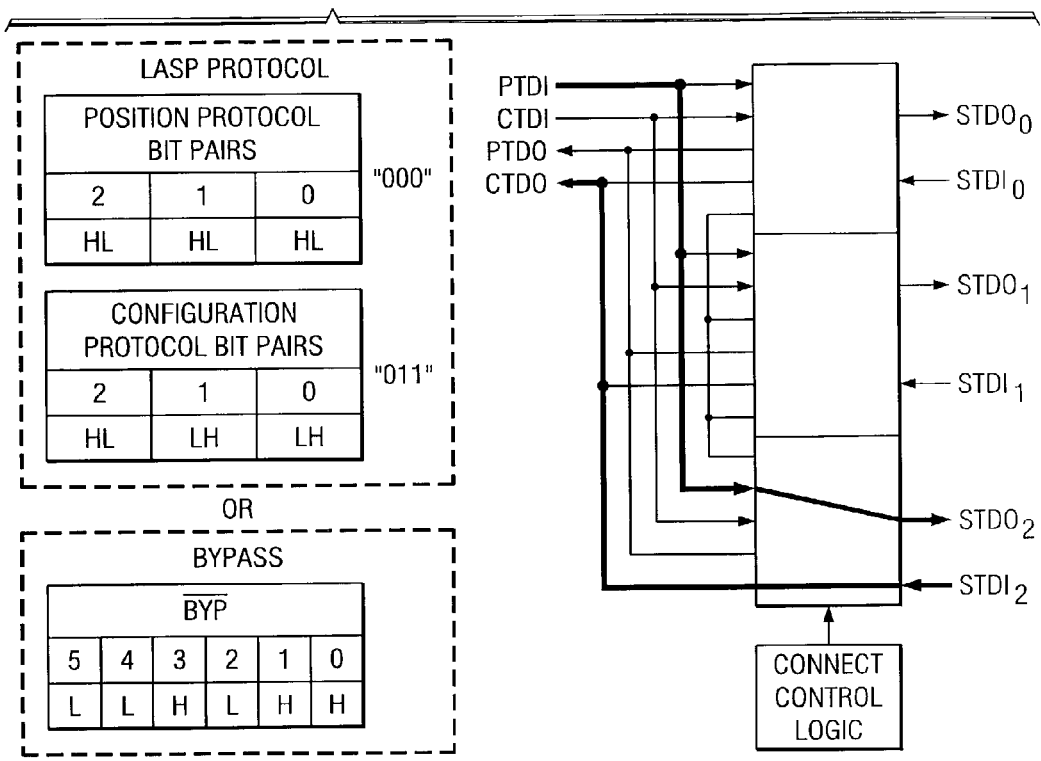
Figure 20:
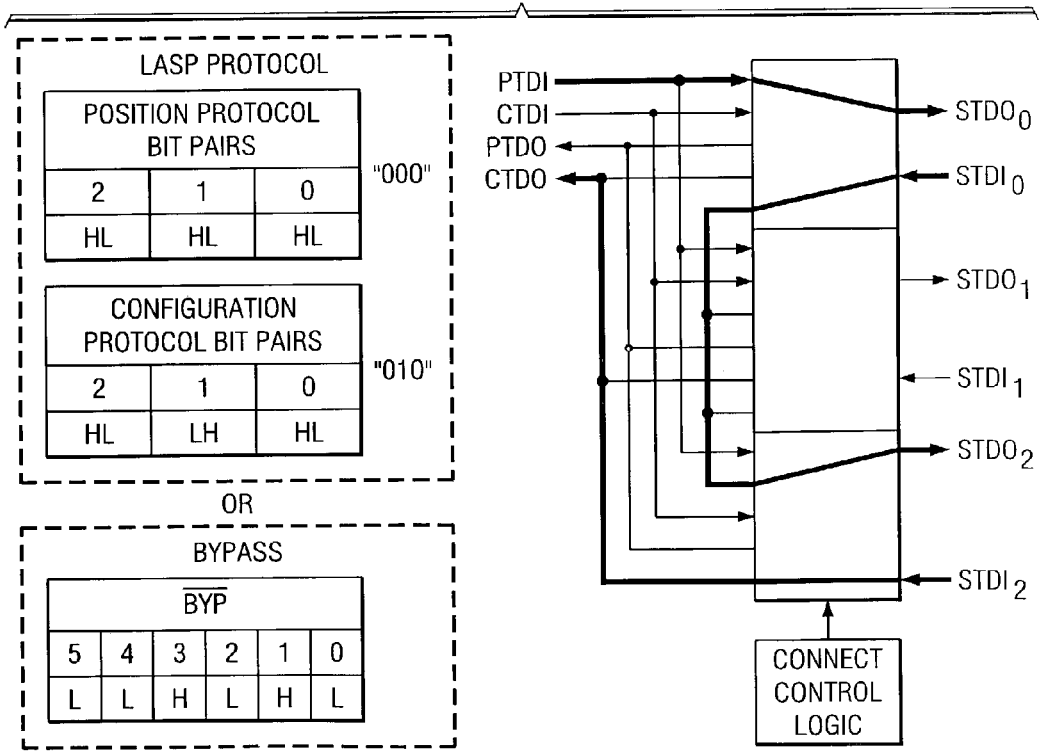
Figure 21:
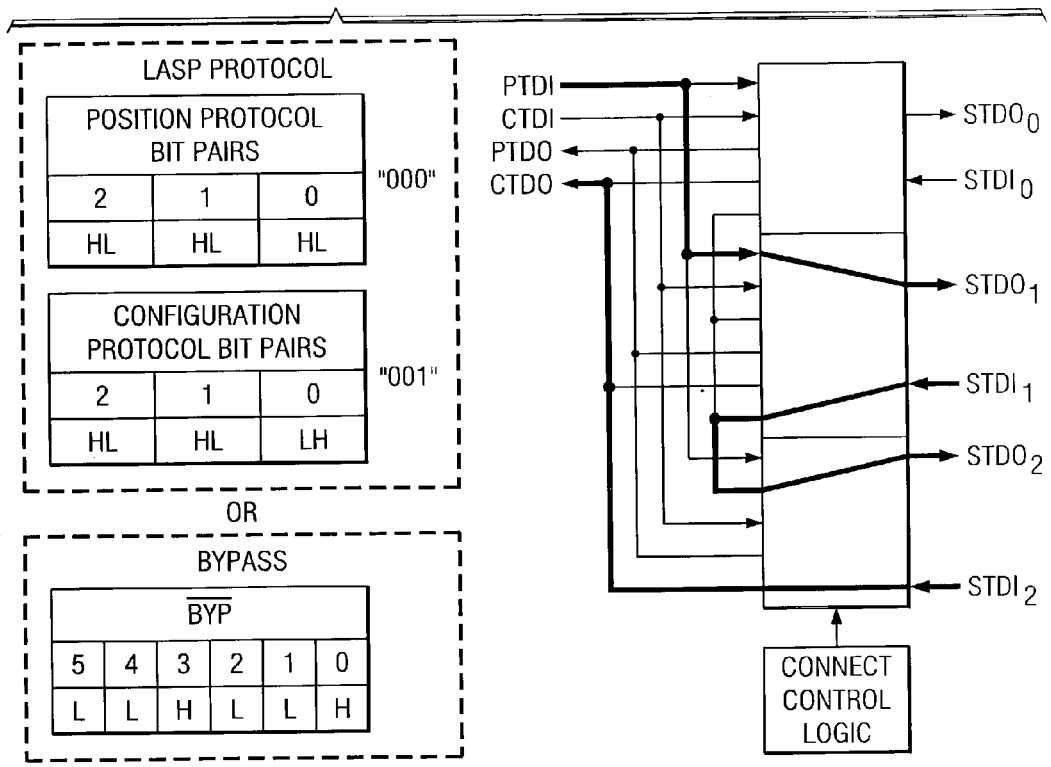
Figure 22:
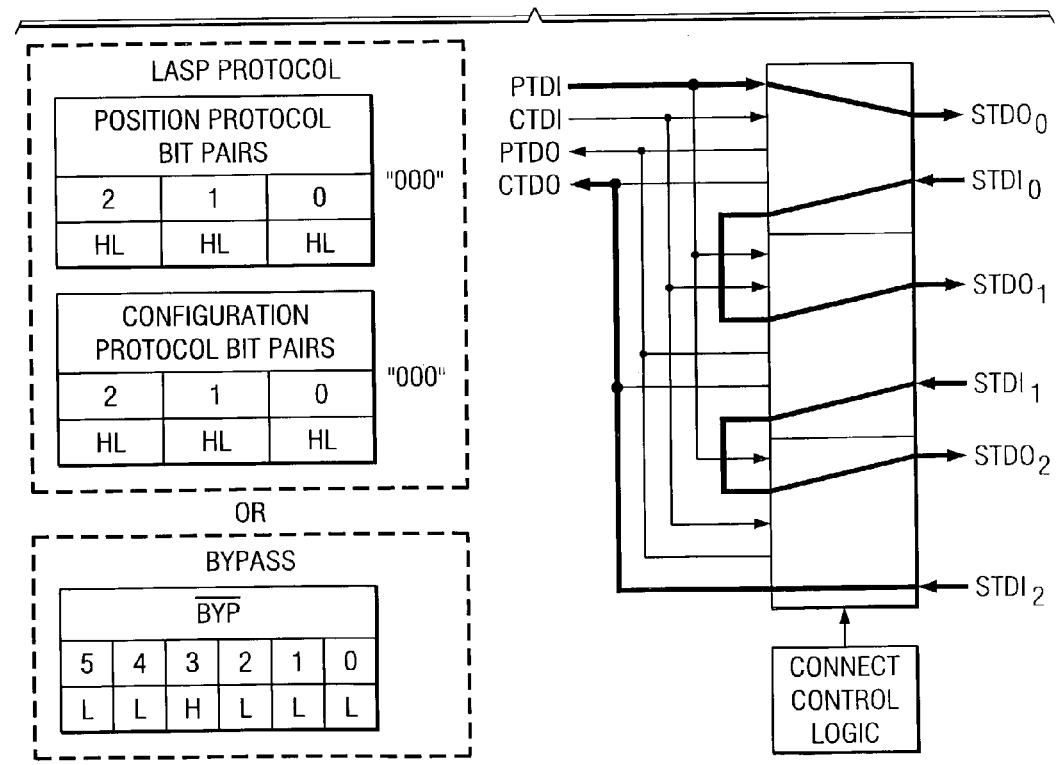

FIG. 15 shows a first LASP in a chain of cascaded LASP, which device is not the last in the chain, in which all 3 TAPs are turned OFF. FIG. 16 shows a first LASP in a chain of cascaded LASP, which device is not the last in the chain, having TAP 0 turned ON and illustrates via bolded lines the data flow to and from the SBS. FIG. 17 shows a first LASP in a chain of cascaded LASPs, which device is not the last in the chain, having TAP 1 tuned ON and illustrates via bolded lines the data flow to and from the SBS. FIG. 18 shows a first LASP in a chain of cascaded LASPs, which device is not the last in the chain, having TAPs 0 and 1 turned ON and illustrates via bolded lines the data flow to and from the SBSs. FIG. 19 shows a first LASP in a chain of cascaded LASPs, which device is not the last in the chain, having TAP 2 turned ON and illustrating via bolded lines the data flow to and from the SBS. FIG. 20 shows a first LASP in a chain of cascaded LASPs, which device is not the last in the chain, having TAPs 0 and 2 turned ON and illustrates via bolded lines the data flow to and from the SBSs. FIG. 21 shows a first LASP in a chain of cascaded LASPs, which device is not the last in the chain, having TAPs 1 and 2 turned ON and illustrates via bolded lines the data flow to and from the SBSs. FIG. 22 shows a first LASP in a chain of cascaded LASPs, which device is not the last in the chain, having all 3 TAPs 0, 1 and 2 turned ON and illustrates via bolded lines the data flow to and from the SBSs.

FIG. 23 to FIG. 30 show the primary to secondary TAPs connections when the LASP is cascaded with one or more LASP and is not first, nor last in the cascade chain. An example of three LASPs being cascaded is used in this embodiment. In this case when connecting the primary to secondary TAPs using LASP protocol, the Position bits are "001" after the bit pairs received during select protocol are decoded. When connecting the primary to secondary TAPs using ($BYP_5$–$BYP_0$) inputs, $BYP_4$ and $BYP_3$ are set to HIGH. When ($BYP_2$–$BYP_0$) inputs are set to HIGH or the configuration bits received during select protocol are decoded as "111" then none of the secondary TAPs are connected. However input CTDI is connected to out CTDO.

Figure 23:
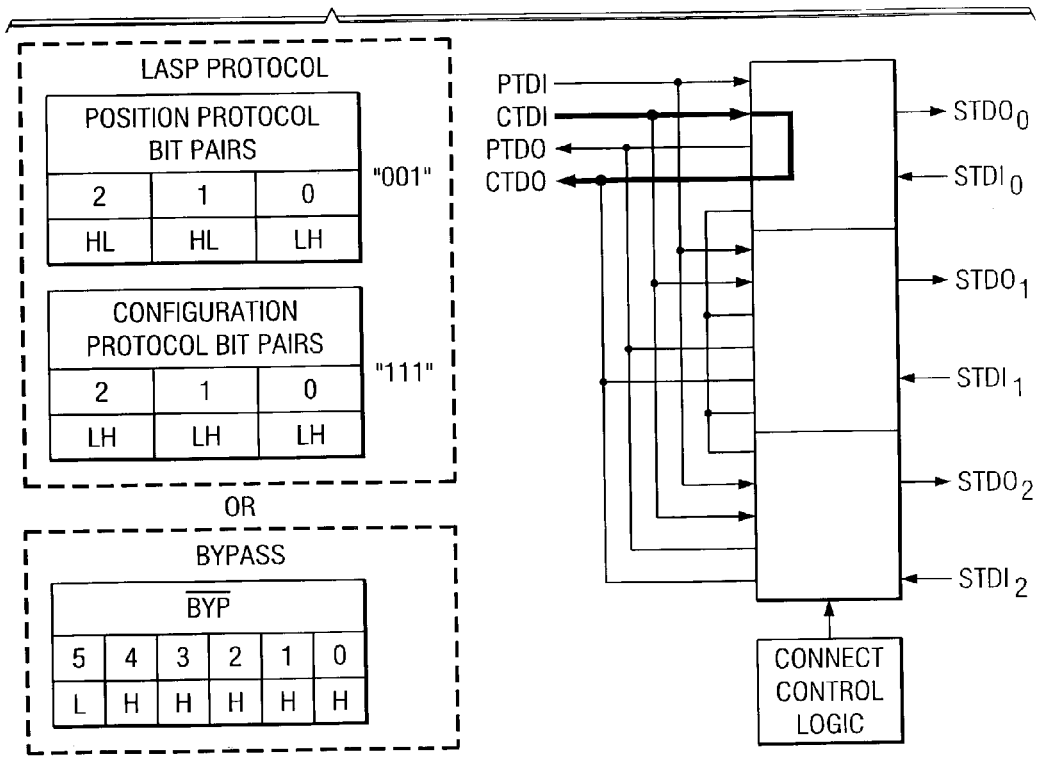
FIG. 23–FIG. 30 depict the primary to secondary TAPs connections when the LASP is cascaded with one or more LASPs and is not first and not last LASP in the cascade chain. It includes examples of command field of LASP protocol and protocol bypass inputs required for configuring the primary to secondary TAPs connections.
Figure 24:
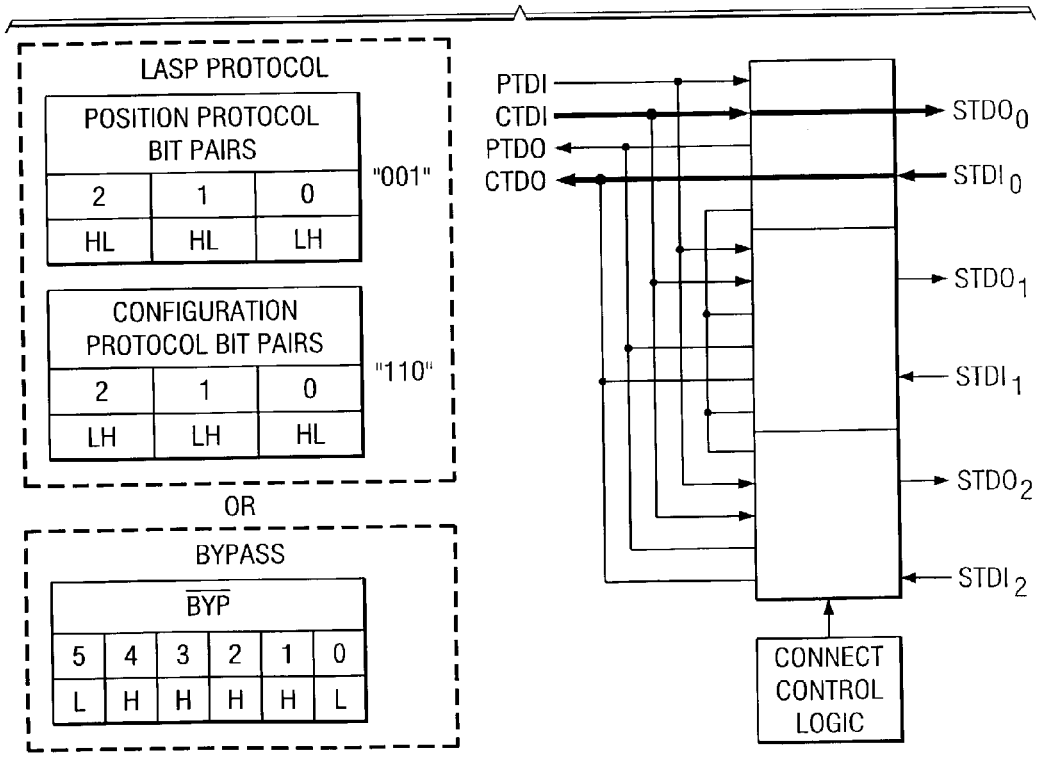
Figure 25:
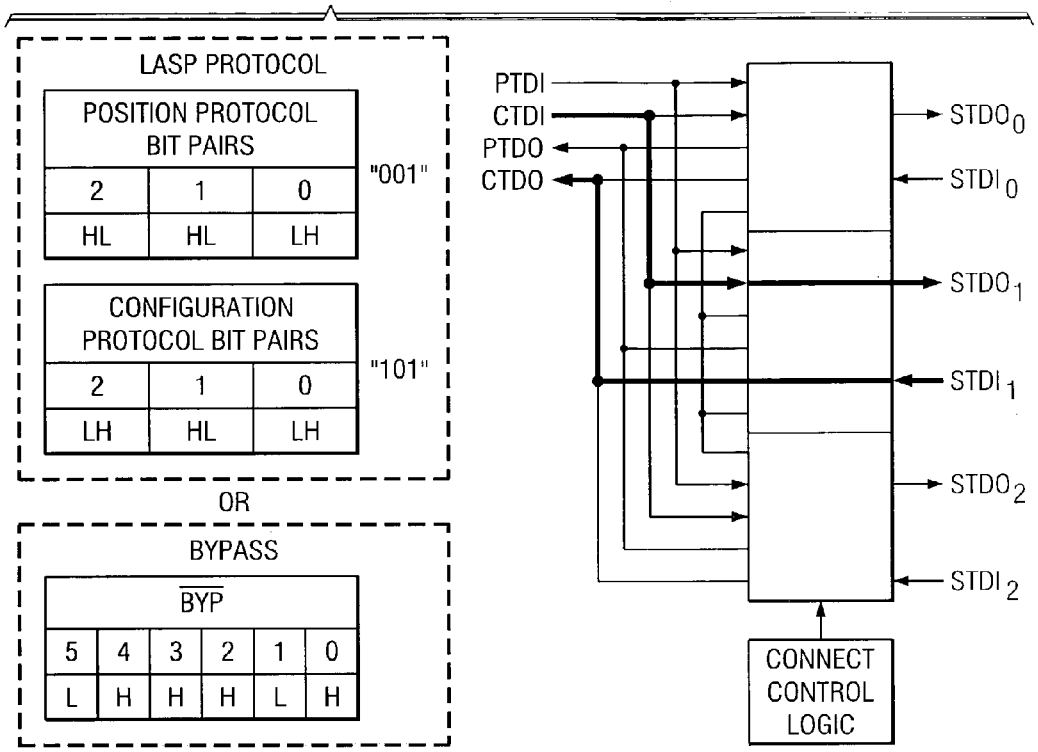
Figure 26:
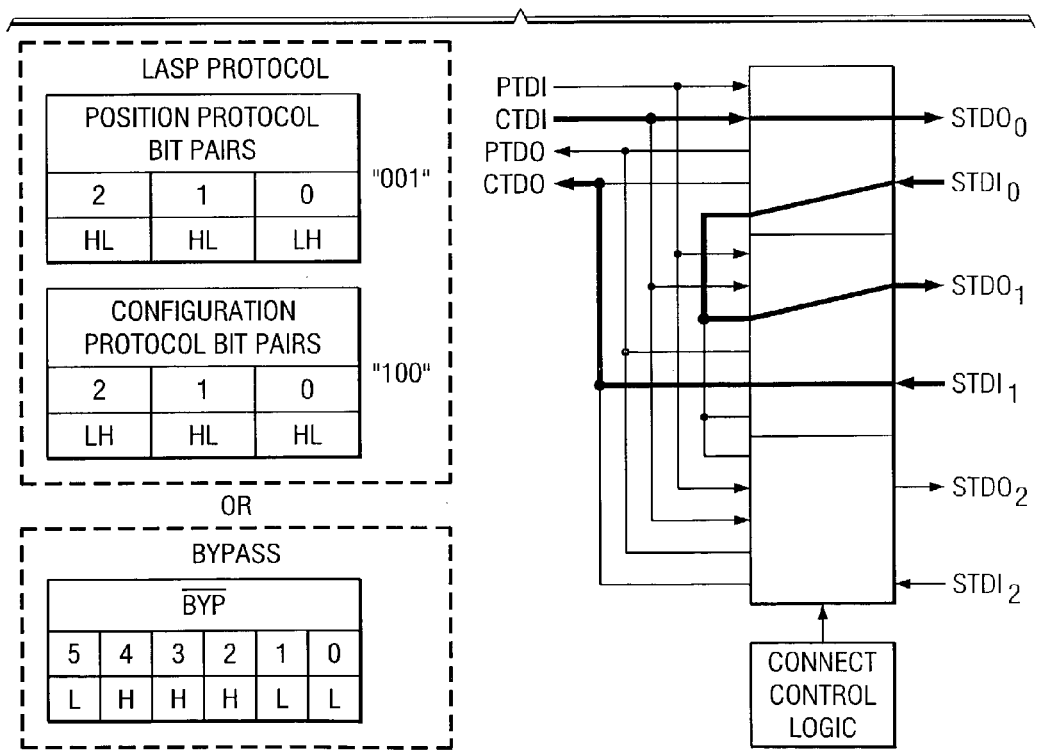
Figure 27:
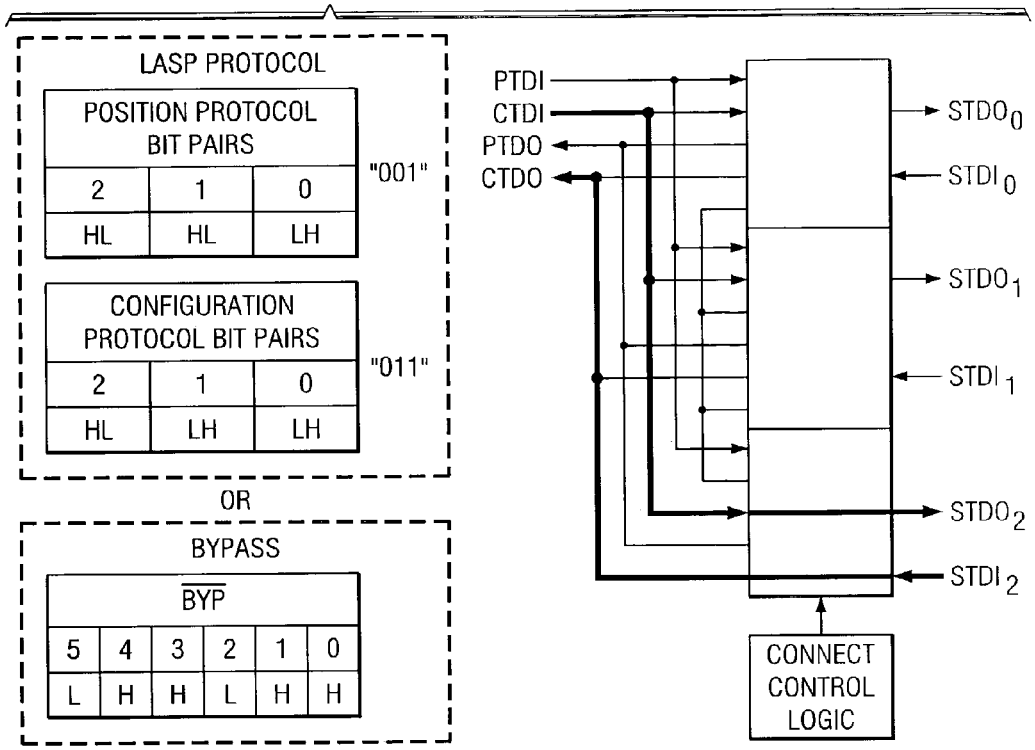
Figure 28:
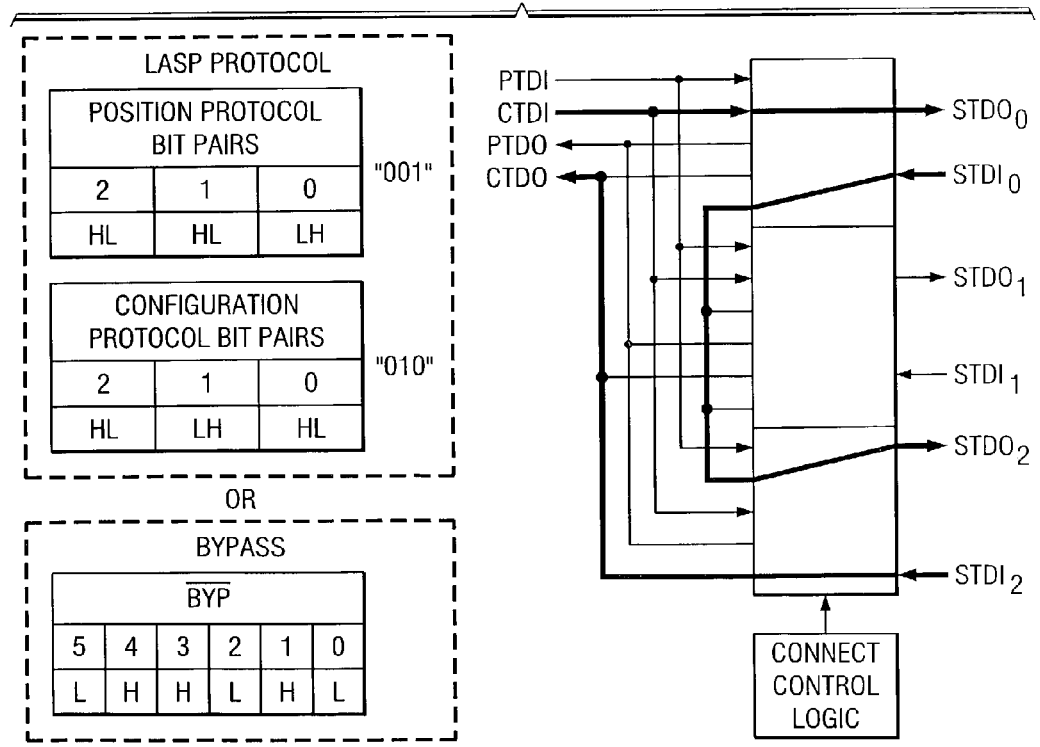
Figure 29:
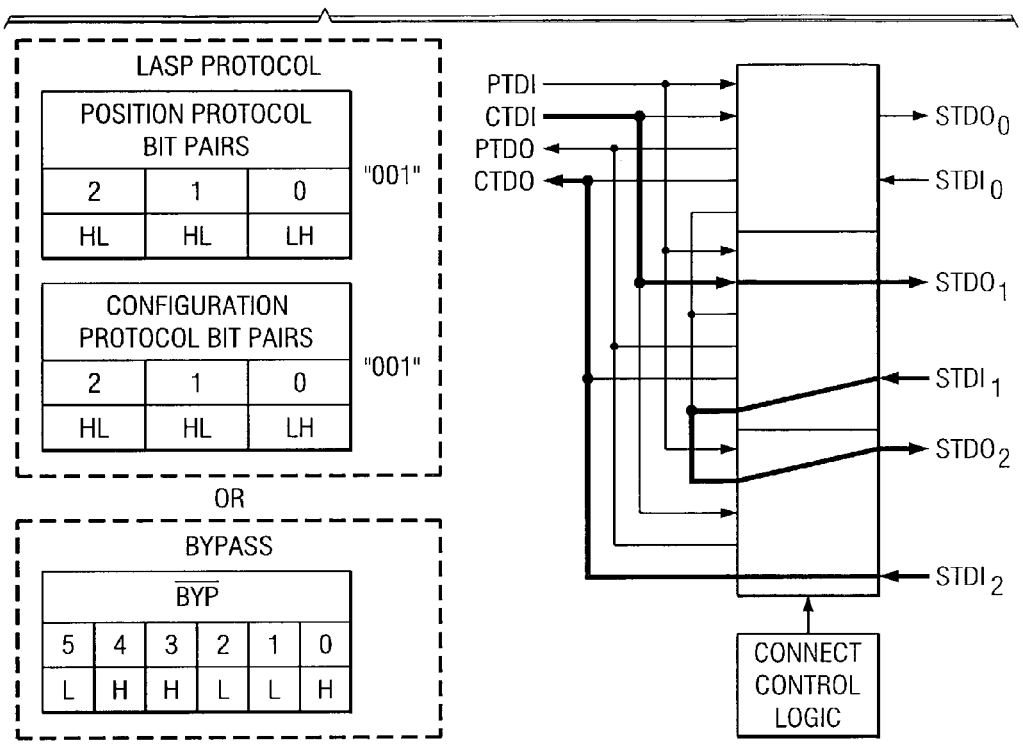
Figure 30:
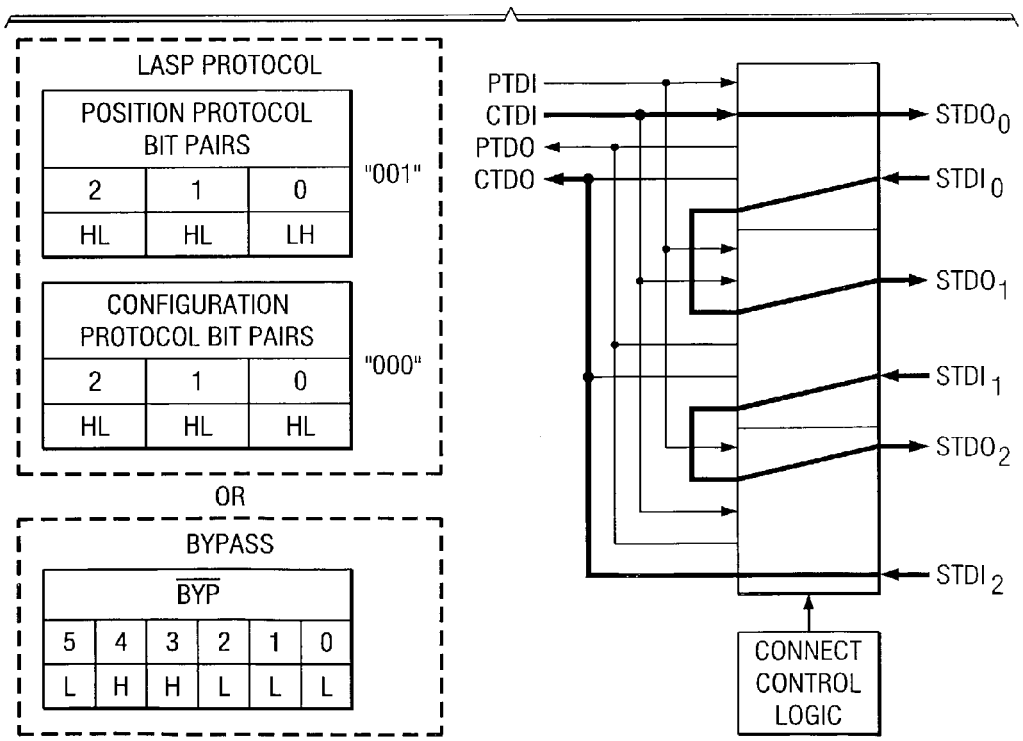

FIG. 23 shows a LASP in a chain of cascaded LASPs, which device is not the first or the last in the chain, in which all 3 TAPs are turned OFF. FIG. 24 shows a LASP in a chain of cascaded LASPS, which device is not the first or the last in the chain, having TAP 0 turned ON and illustrates via bolded lines the data flow to and from the SBS. FIG. 25 shows a LASP in a chain of cascaded LASPs, which device is not the first or the last in the chain, having TAP 1 tuned ON and illustrates via bolded lines the data flow to and from the SBS. FIG. 26 shows a LASP in a chain of cascaded LASPs, which device is not the first or the last in the chain, having TAPs 0 and 1 turned ON and illustrates via bolded lines the data flow to and from the SBSs. FIG. 27 shows a LASP in a chain of cascaded LASPs, which device is not the first or the last in the chain, having TAP 2 turned ON and illustrates via bolded lines the data flow to and from the SBS. FIG. 28 shows a LASP in a chain of cascaded LASPs, which device is not the first or the last in the chain, having TAPs 0 and 2 turned ON and illustrates via bolded lines the data flow to and from the SBSs. FIG. 29 shows a LASP in a chain of cascaded LASPs, which device is not the first or the last in the chain, having TAPs 1 and 2 turned ON and illustrates via bolded lines the data flow to and from the SBSs. FIG. 30 shows a LASP in a chain of cascaded LASPs, which device is not the first or the last in the chain, having all 3 TAPs 0, 1 and 2 turned ON and illustrates via bolded lines the data flow to and from the SBSs.

FIG. 31 to FIG. 38 show the primary to secondary TAPs connections when the LASP is cascaded with one or more LASPs and is not first, but last in the cascade chain. An example of three LASPs being cascaded is used in this embodiment. In this case when connecting the primary to secondary TAPs using LASP protocol, the Position bits are "010" after the bit pairs received during select protocol are decoded. When connecting the primary to secondary TAPs using ($BYP_5$–$BYP_0$) inputs, $BYP_4$ is set to HIGH and $BYP_3$ is set to LOW. When ($BYP_2$–$BYP_0$) inputs are set to HIGH or the configuration bits received during select protocol are decoded as "111" then none of the secondary TAPs are connected.

Figure 31:
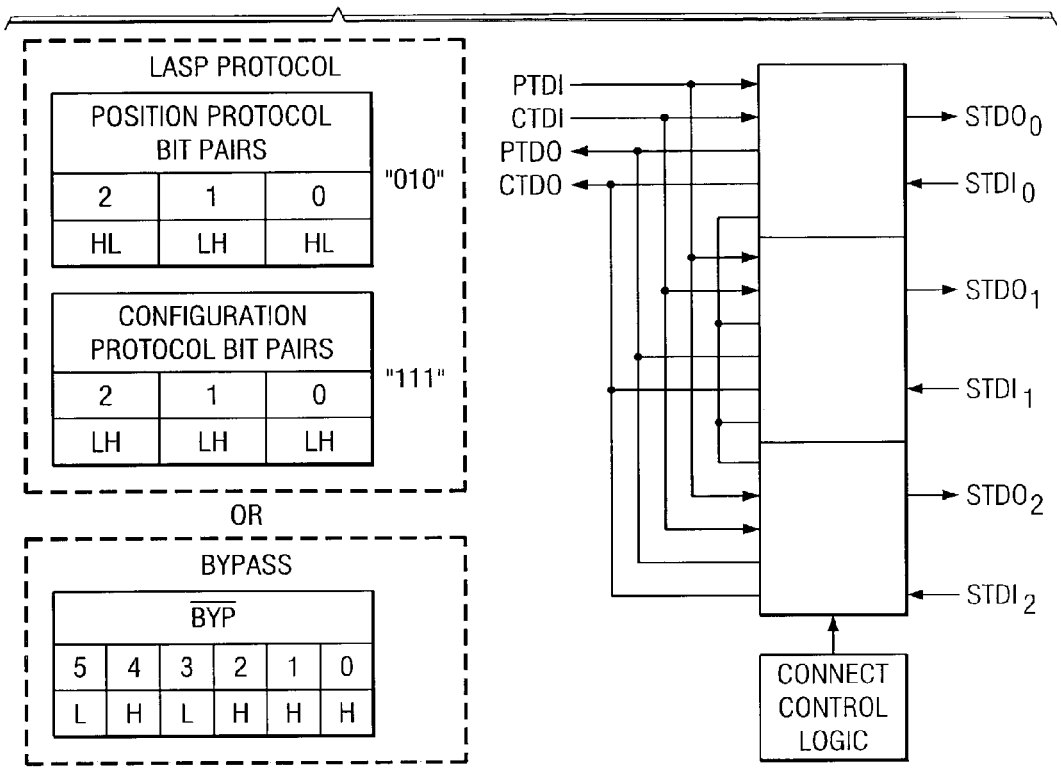
FIG. 31–FIG. 38 depict the primary to secondary TAPs connections when the LASP is cascaded with one or more LASPs and is not first, but is the last LASP in the cascade chain. It includes examples of command field of LASP protocol and protocol bypass inputs required for configuring the primary to secondary TAPs connections.
Figure 32:
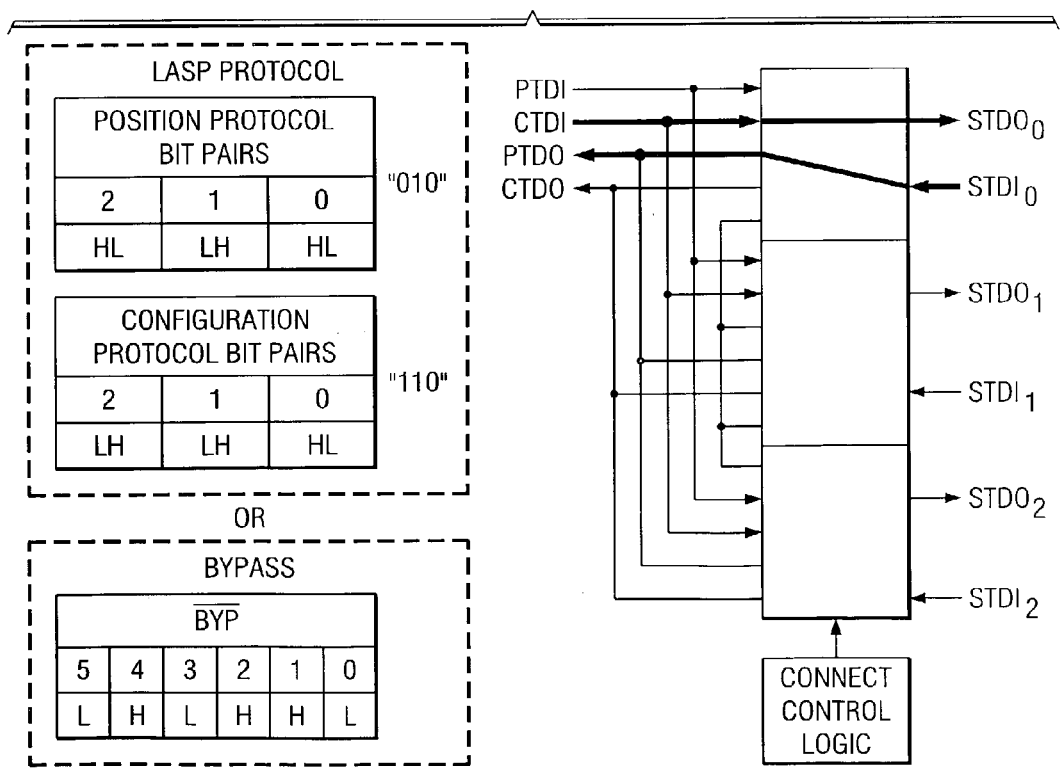
Figure 33:
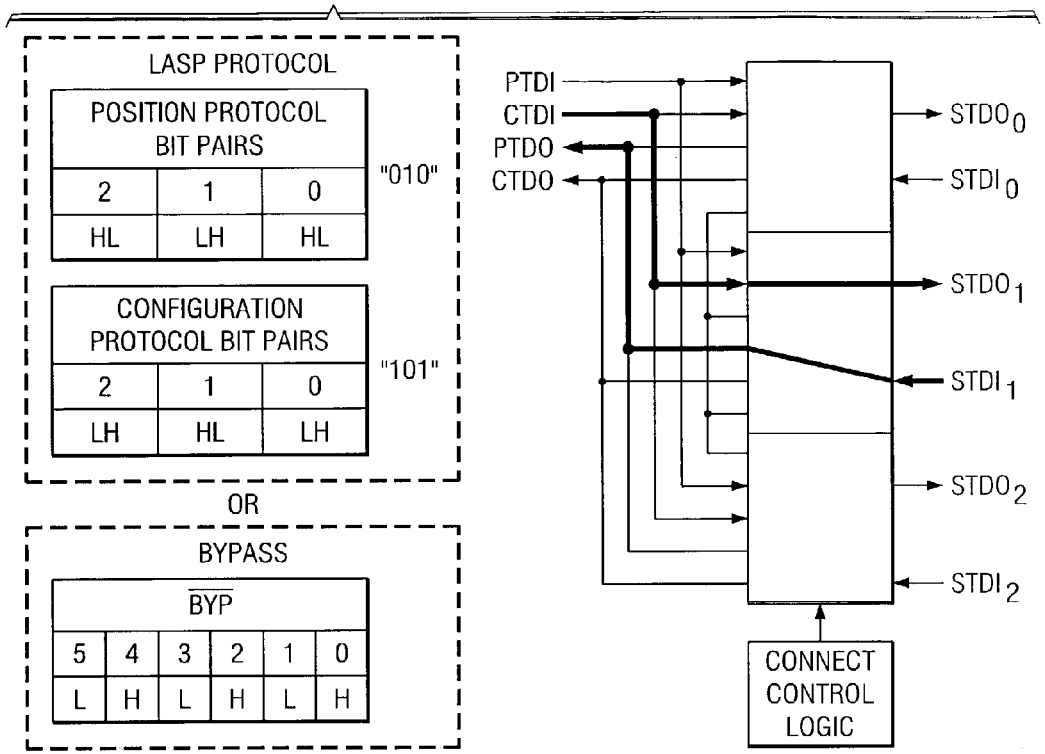
Figure 34:
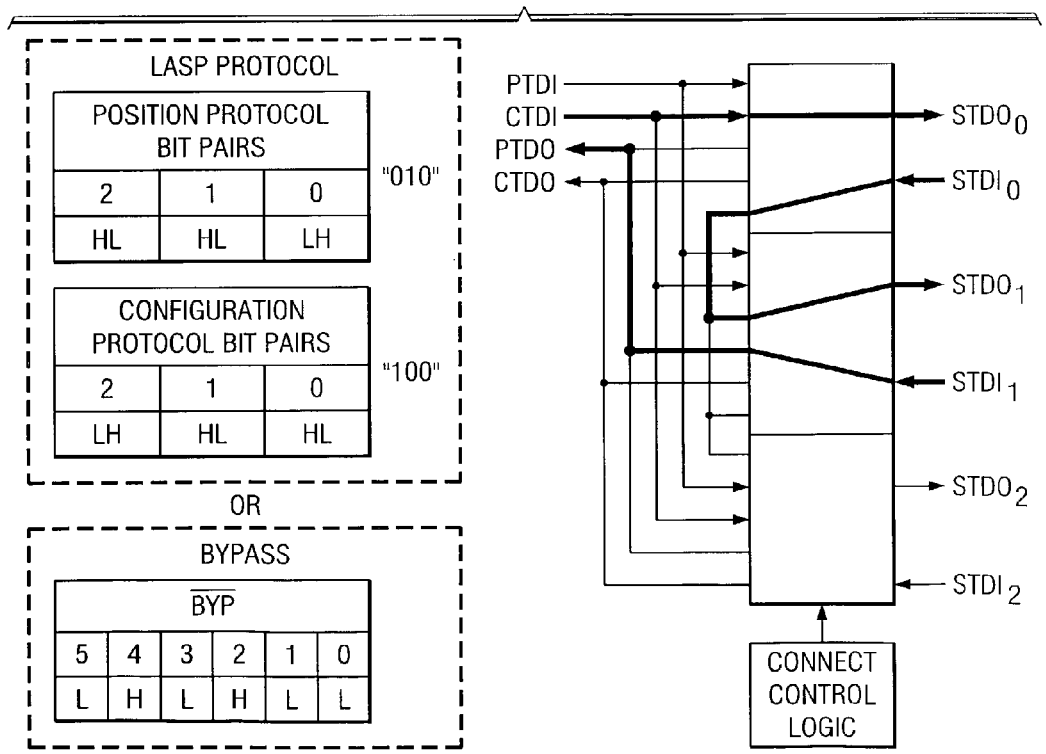
Figure 35:
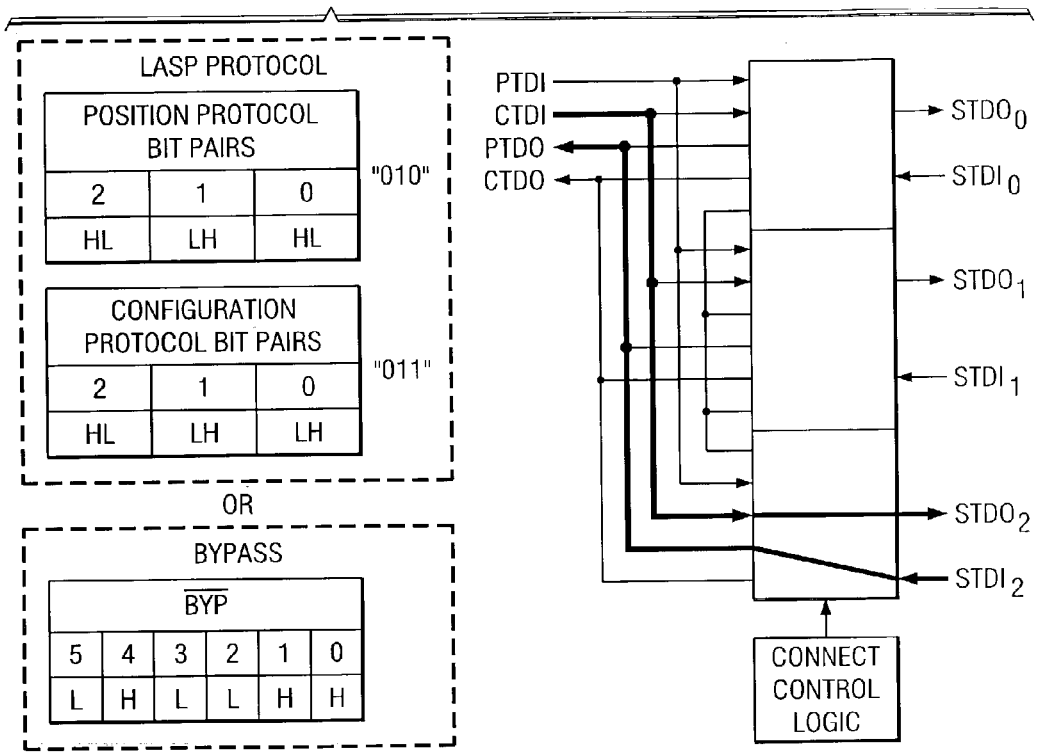
Figure 36:
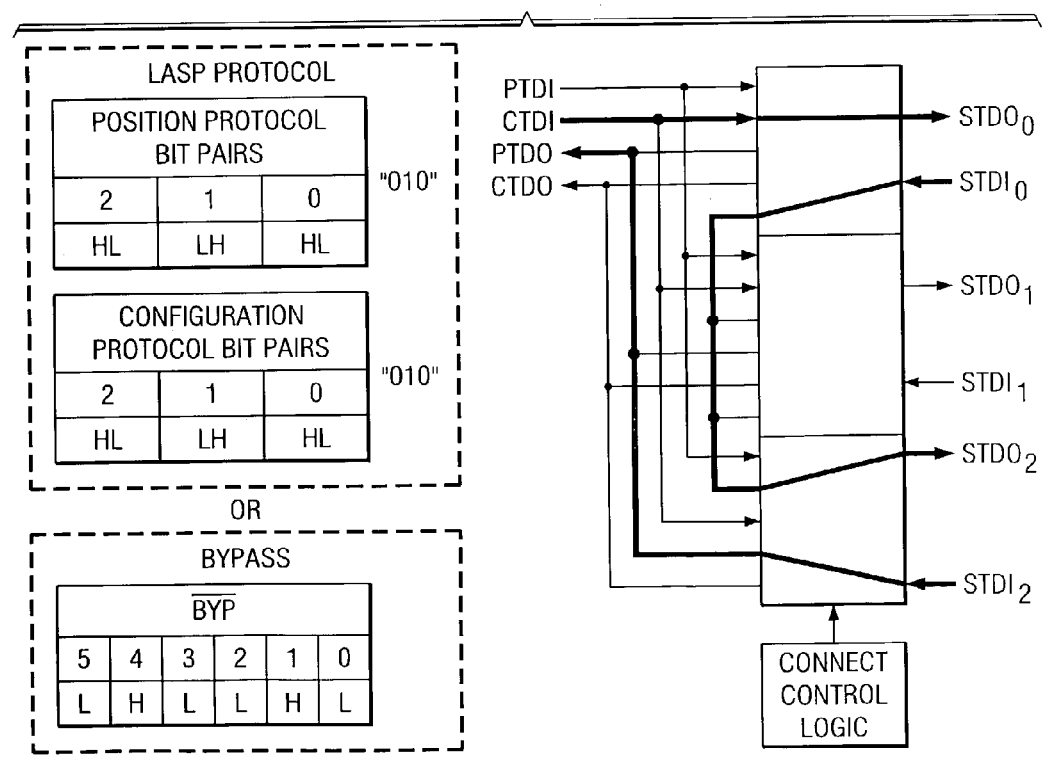
Figure 37:
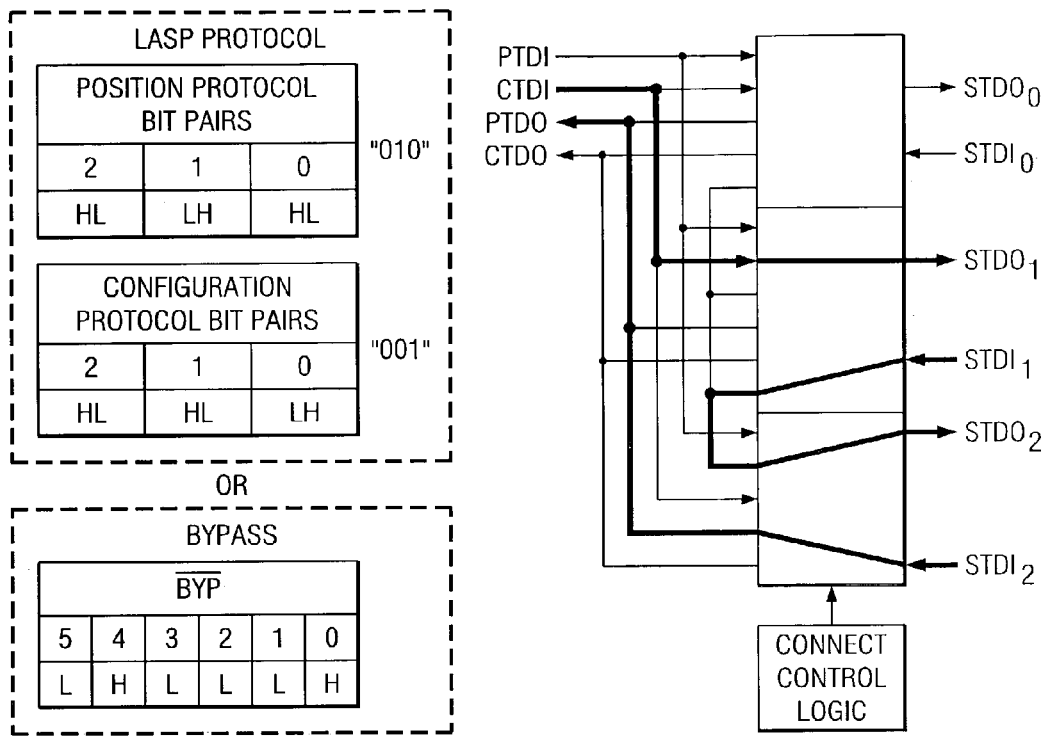
Figure 38:
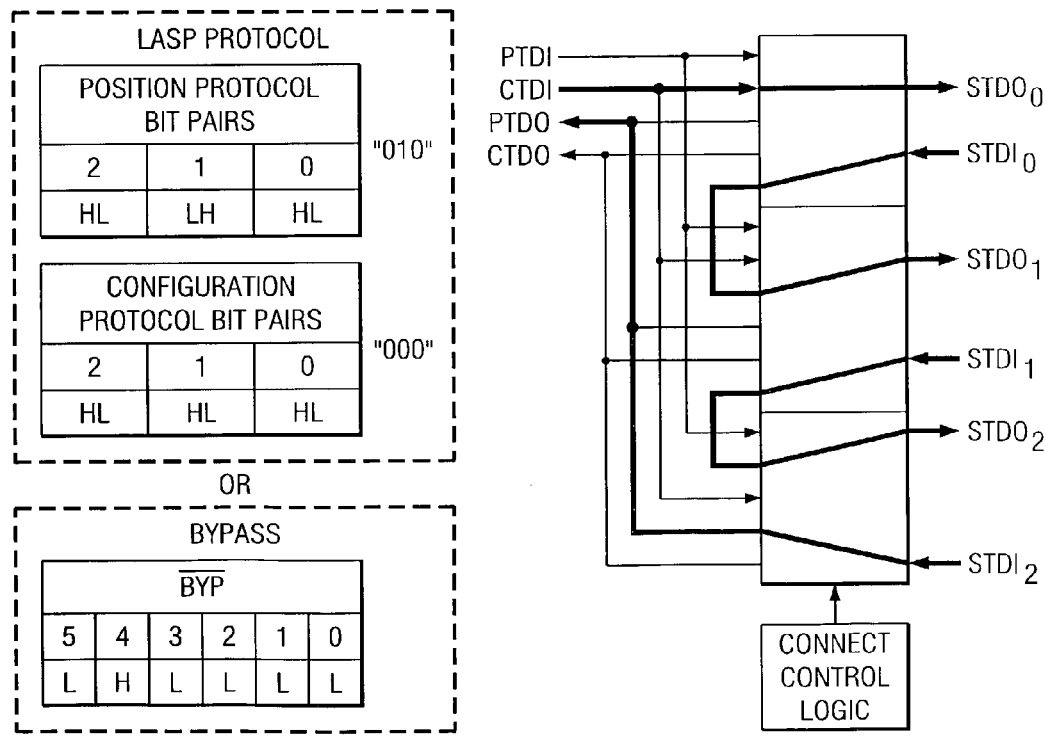

FIG. 31 shows a last LASP in a chain of cascaded LASPs, which device is not the first in the chain, in which all 3 TAPs are turned OFF. FIG. 32 shows a last LASP in a chain of cascaded LASPs, which device is not the first in the chain, having TAP 0 turned ON and illustrates via bolded lines the data flow to and from the SBS. FIG. 33 shows a last LASP in a chain of cascaded LASPs, which device is not the first in the chain, having TAP 1 tuned ON and illustrates via bolded lines the data flow to and from the SBS. FIG. 34 shows a last LASP in a chain of cascaded LASPs, which device is not the first in the chain, having TAPs 0 and 1 turned ON and illustrates via bolded lines the data flow to and from the SBSs. FIG. 35 shows a last LASP in a chain of cascaded LASPs, which device is not the first in the chain, having TAP 2 turned ON and illustrates via bolded lines the data flow to and from the SBS. FIG. 36 shows a last LASP in a chain of cascaded LASPs, which device is not the first in the chain, having TAPs 0 and 2 turned ON and illustrates via bolded lines the data flow to and from the SBSs. FIG. 37 shows a last LASP in a chain of cascaded LASPs, which device is not the first in the chain, having TAPs 1 and 2 turned ON and illustrates via bolded lines the data flow to and from the SBSs. FIG. 38 shows a last LASP in a chain of cascaded LASPs, which device is not the first in the chain, having all 3 TAPs 0, 1 and 2 turned ON and illustrates via bolded lines the data flow to and from the SBSs.

All of the above cases are tabulated in FIG. 39 to FIG. 42. FIGS. 39 and 40 summarize all of the above described embodiments using the protocol. FIGS. 41 and 42 summarize all the above described embodiments using the bypass mode.

Figure 43A:
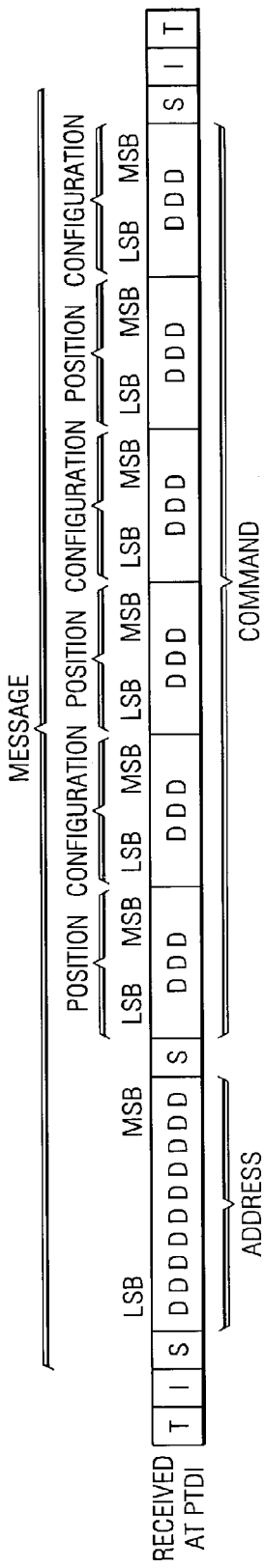
FIG. 43 is an example of a complete select and acknowledge protocol for addressing and configuring the primary to secondary TAPs connections of 3 cascaded LASPs.
Figure 43B:
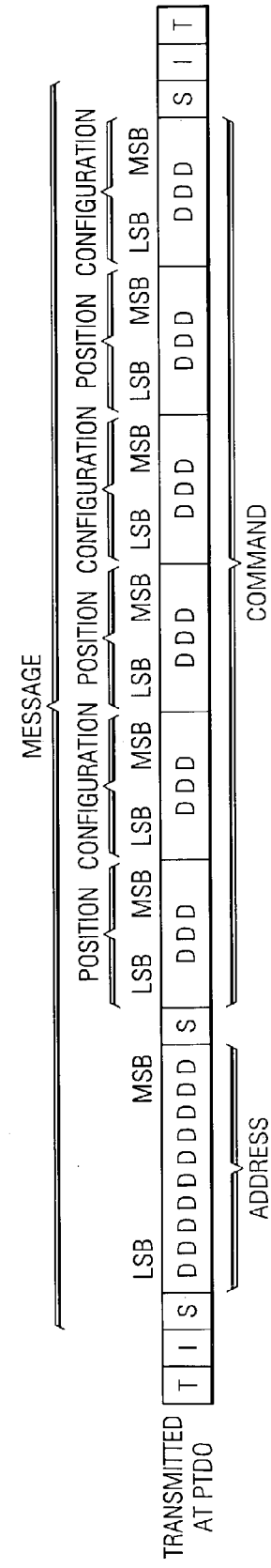

FIG. 43 is an example of a complete Select and Acknowledge Protocol for addressing and connecting primary to secondary TAPs of three cascaded LASPs. Each protocol consists of address and command fields. Command field consists of position field and configuration field for each LASP in the cascade chain. Select bit pairs frame address and command fields, at the beginning and end, and idle bit pairs frame the message at the beginning and end. All the LASPs that are cascaded have their pins $A_9$–$A_0$ connected together as such they have the same address. If position and configuration for a particular LASP within a cascade chain are not received in the select protocol, then its secondary TAPs are disconnected and CTDI and CTDO are connected/disconnected depending on its position in cascade chain as explained earlier.

Figure 44:
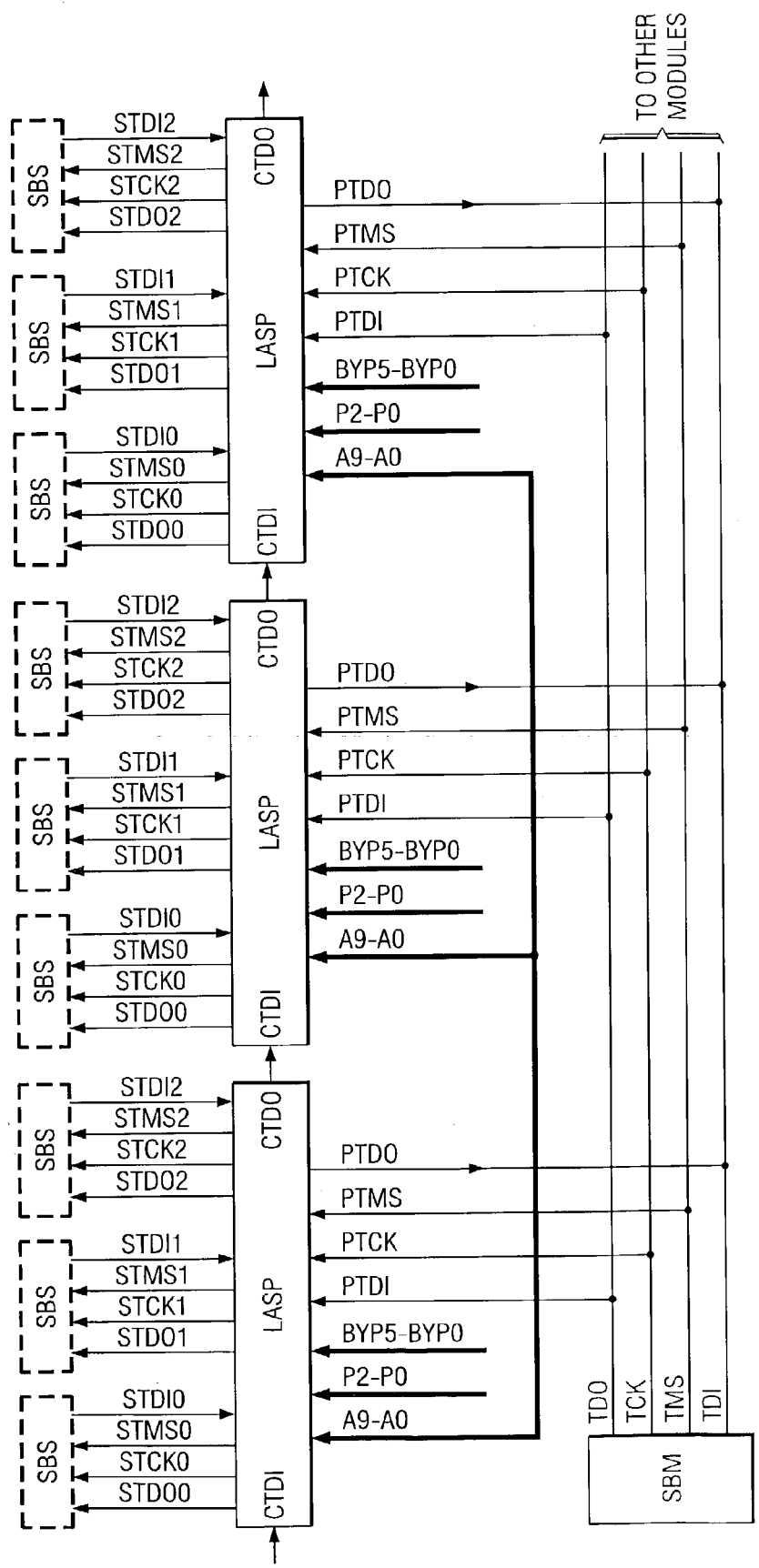
FIG. 44 is an example of a backplane to board connection using serial bus master (SBM) and 3 LASPs cascaded.

FIG. 44 shows three LASPs cascaded. Each LASP is wired at its primary TAP to common (multidrop) TAP signals (PTDI, PTCK, PTMS, PTDO) sourced from a SBM and fans out these signals as secondary signals (STDI, STCK, STMS, STDO) to or from the selected group of SBSs. CTDI input of the LASP CIRCUIT is wired to the CTDO output of the previous LASP in cascade chain. CTDI of the first LASP in cascaded chain is not wired and is pulled to HIGH with an internal pull-up. CTDO output of the last LASP in cascade chain is not wired.

Figure 45:
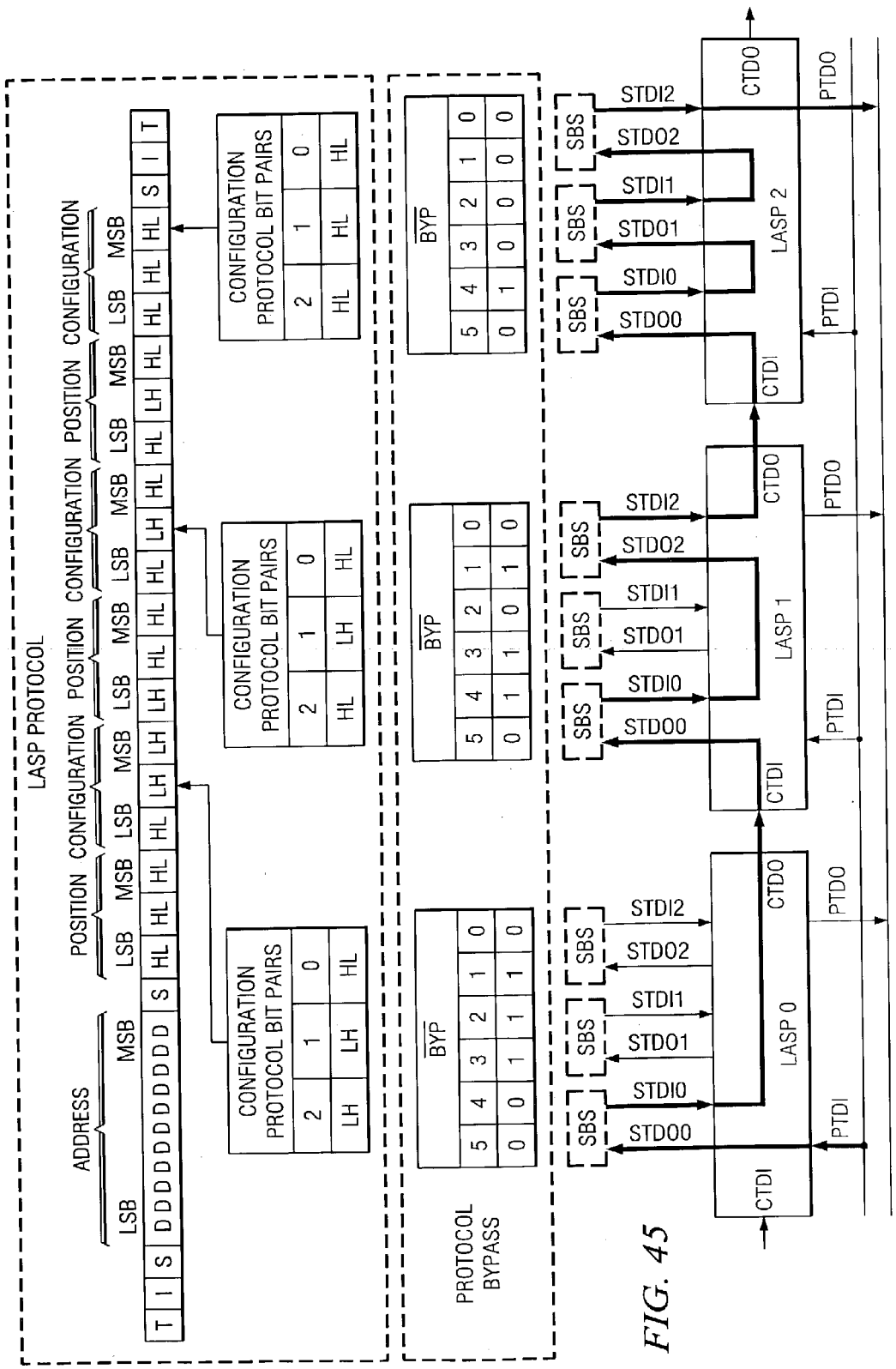
FIG. 45–FIG. 51 are examples of primary to secondary TAPs connections and scan data path of the 3 cascaded LASPs using LASP protocol or bypass inputs.

FIG. 45 is an illustration of primary to secondary TAPs connections and scan data path of three cascaded LASPs using LASP Protocol or protocol bypass inputs. The first LASP in the cascade chain has only STAP0 active, second LASP has STAP0 and STAP2 active while third or last LASP has all the three secondary TAPs (STAP0, STAP1, STAP2) active. The connections of the LASPs and the SBSs are shown in bolded lines.

Figure 46:
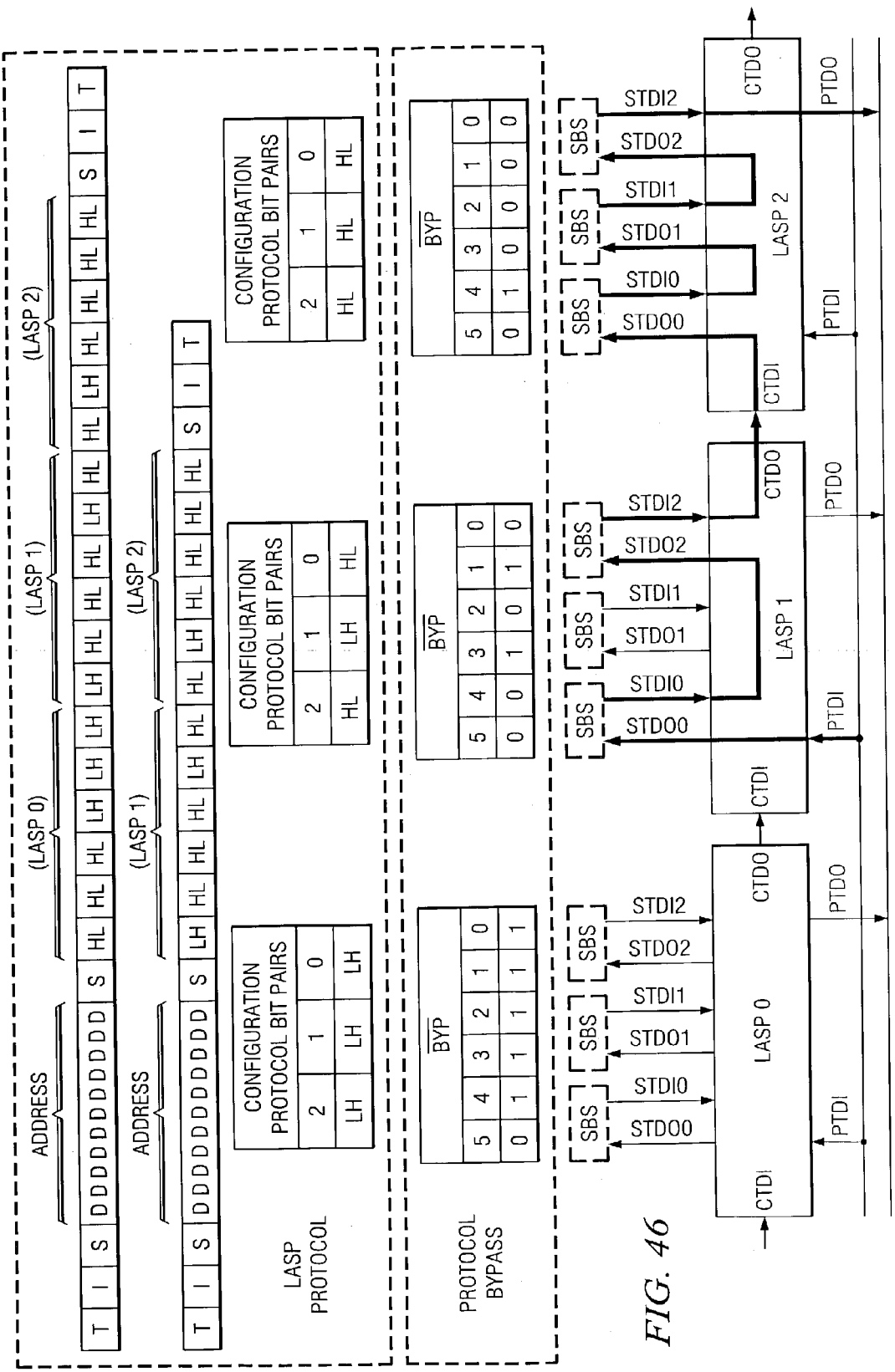

FIG. 46 is an illustration of primary to secondary TAPs connections and scan data path of three cascaded LASPs using LASP Protocol or protocol bypass inputs. Here during the select protocol, Position and Configuration for the first LASP (LASP0) are not received or if received the configuration bits are decoded as "111". The first LASP in cascade chain has all the three secondary TAPs inactive. The second LASP now behaves as the first LASP in cascaded chain and has STAP0 and STAP2 active. Third LASP has all the three secondary TAPs (STAP0, STAP1, STAP2) active. When protocol bypass inputs are used, $BYP_4$ and $BYP_3$ of first LASP CIRCUIT are set HIGH, second LASP has $BYP_4$ input set LOW and $BYP_3$ input set HIGH so that it behaves as first LASP in cascade chain. The connections of the LASP and the SBSs are shown in bolded lines.

Figure 47:
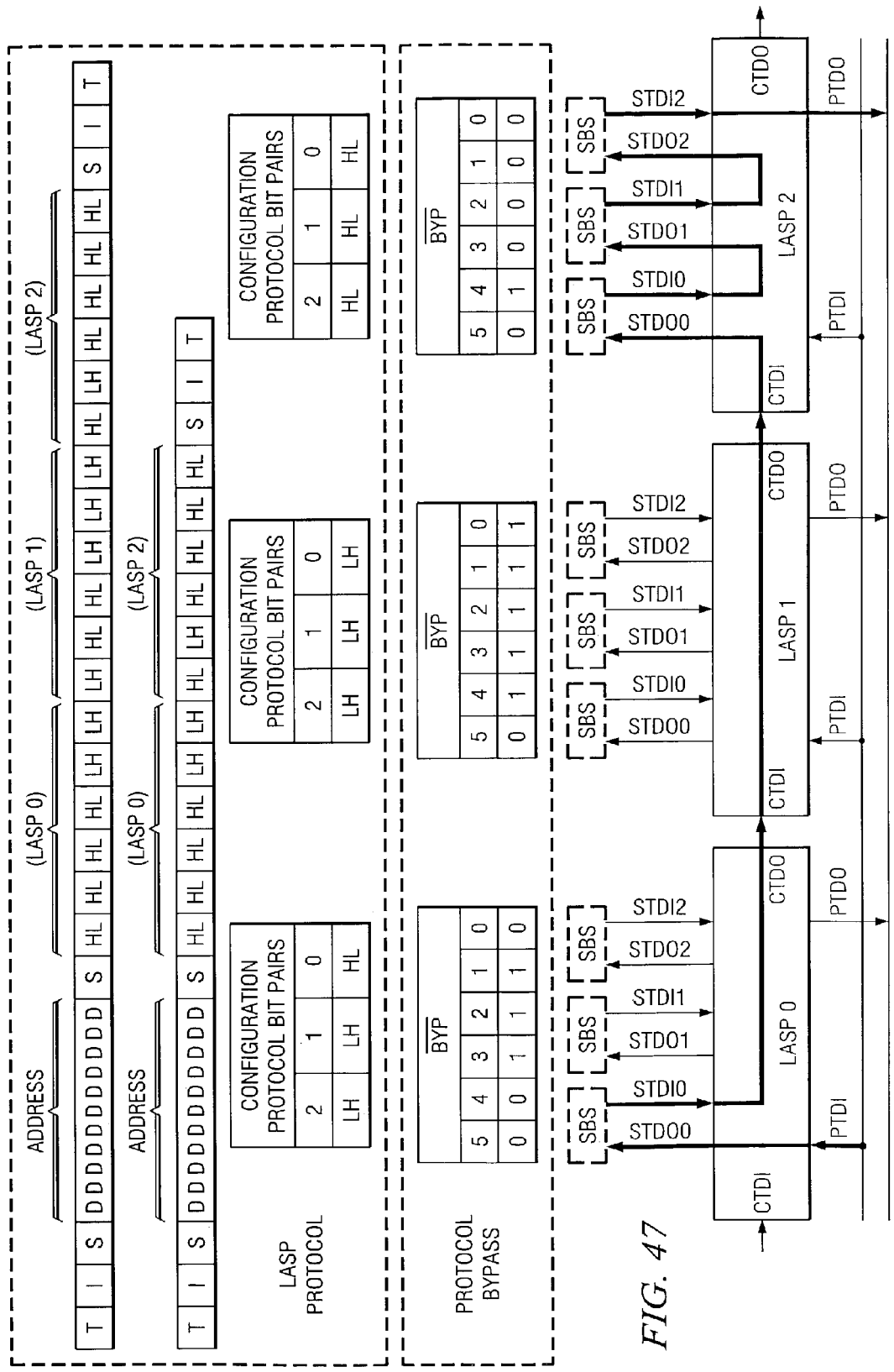

FIG. 47 is an illustration of primary to secondary TAPs connections and scan data path of three cascaded LASPs using LASP Protocol or protocol bypass inputs. Here during the select protocol, Position and Configuration for the second LASP are not received or if received the configuration bits are decoded as "111". The first LASP in cascade chain has only STAP0 active. The second LASP has all three secondary TAPs inactive but CTDI input is connected to CTDO output. The third LASP has all the three secondary TAPs active. The connections of the LASP and the SBSs are shown in bolded lines.

Figure 48:
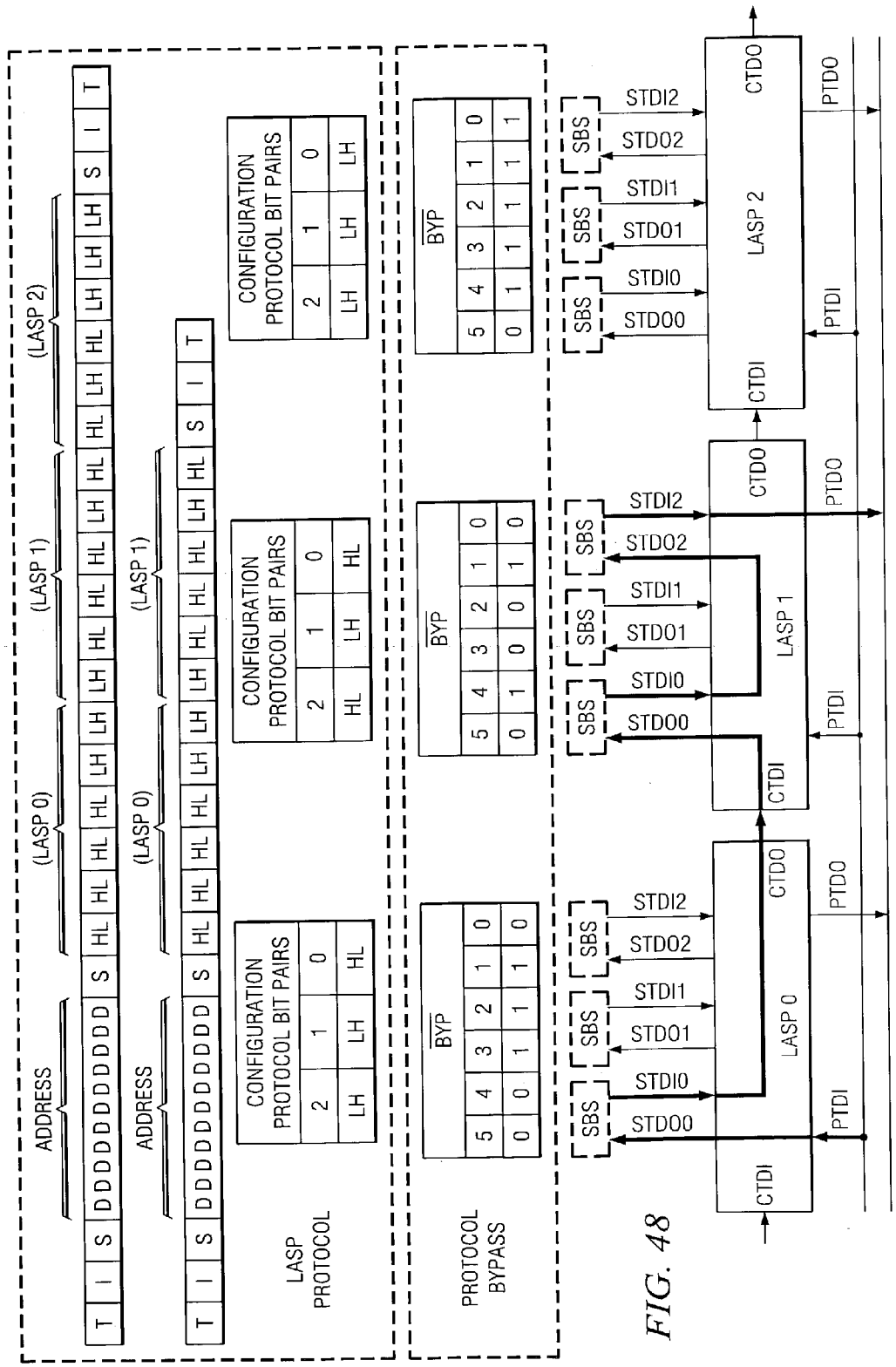

FIG. 48 is an illustration of primary to secondary TAPs connections and scan data path of three cascaded LASP circuits using LASP Protocol or protocol bypass inputs. Here during the select protocol, Position and Configuration for the third LASP CIRCUIT are not received or if received the configuration bits are decoded as "111". The first LASP in cascade chain has only STAP0 active. The second LASP has STAP0 and STAP2 active and behaves as last LASP in cascade chain. It makes the determination that it is the last LASP in the chain from the entire LASP protocol and configures itself to output the LASP protocol to the PTDO line as an acknowledgement message to the SBM. The third LASP has all the three secondary TAPs inactive. When protocol bypass inputs are used, the second LASP has $BYP_4$ input set HIGH and $BYP_3$ input set LOW so that it behaves as last LASP in cascade chain. The $BYP_4$ and $BYP_3$ inputs of third LASP are set HIGH. The connections of the LASP and the SBSs are shown in bolded lines.

Figure 49:
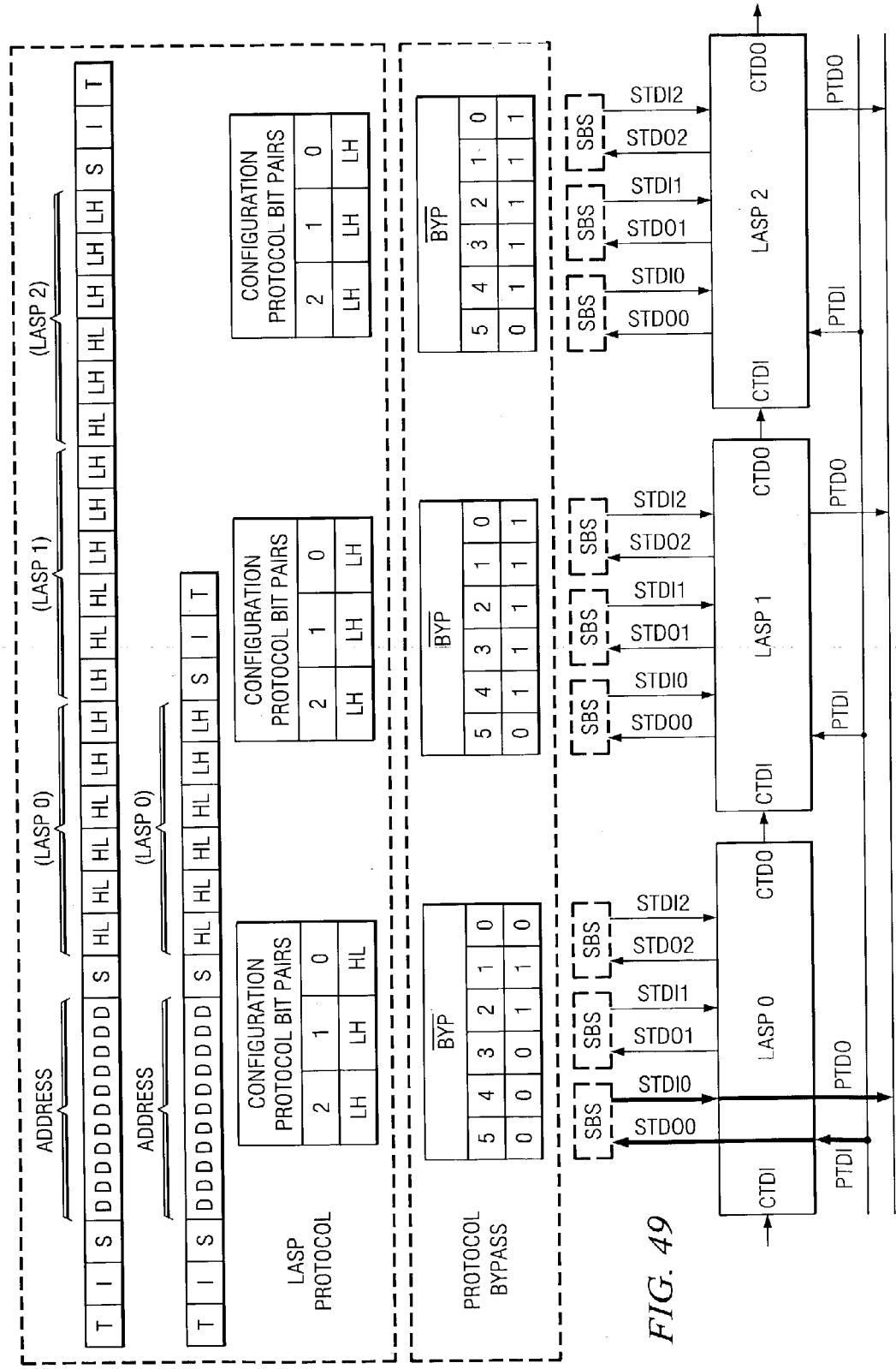

FIG. 49 is an illustration of primary to secondary TAPs connections and scan data path of three cascaded LASPs using LASP Protocol or protocol bypass inputs. Here during the select protocol, Position and Configuration for the second and third LASP are not received or if received their configuration bits are decoded as "111". The first LASP in cascade chain has only STAP0 active and now behaves as a single LASP (not cascaded). The second and third LASP have all three secondary TAPs inactive. When protocol bypass inputs are used, the first LASP has its $BYP_4$ and $BYP_3$ inputs set LOW so that it behaves as a single LASP (not cascaded). The $BYP_4$ and $BYP_3$ inputs of second and third LASP are set HIGH. The connections of LASP 0 to PTDI and PTDO and the SBSs are shown in bolded lines.

Figure 50:
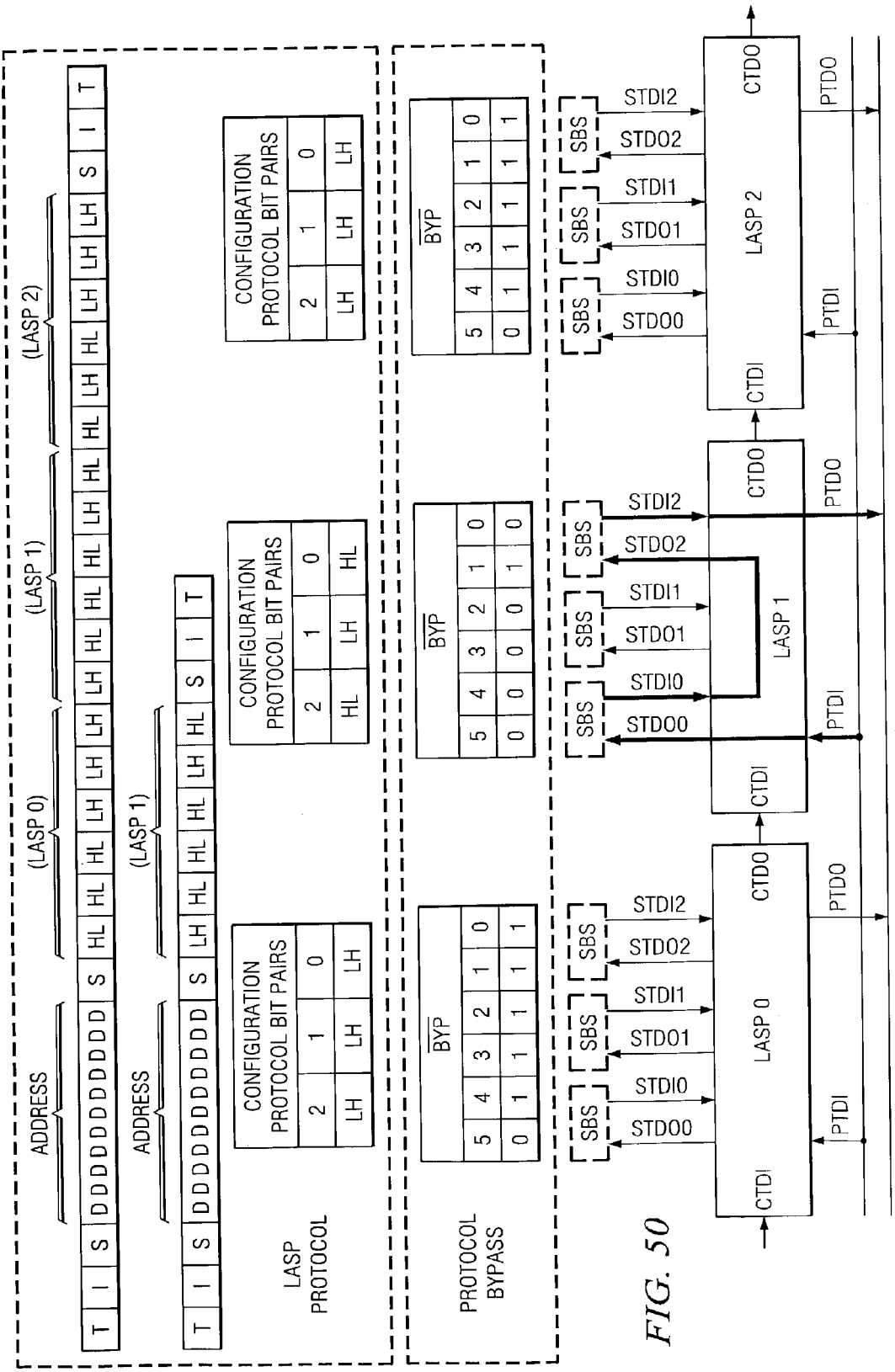

FIG. 50 is an illustration of primary to secondary TAPs and scan data path of three cascaded LASPs using LASP Protocol or protocol bypass inputs. Here during the select protocol, Position and Configuration for the first and third LASP are not received or if received their configuration bits are decoded as "111". The second LASP in cascade chain has STAP0 and STAP2 active and now behaves as a single device (not cascaded). The first and third LASPs have all the three secondary TAPs inactive. When protocol bypass inputs are used, the second LASP has its $BYP_4$ and $BYP_3$ inputs set LOW so that it behaves as a single LASP (not cascaded). The $BYP_4$ and $BYP_3$ inputs of first and third LASP are set HIGH. The connections of LASP 1 to PTDI and PTDO and the SBSs are shown in bolded lines.

Figure 51:
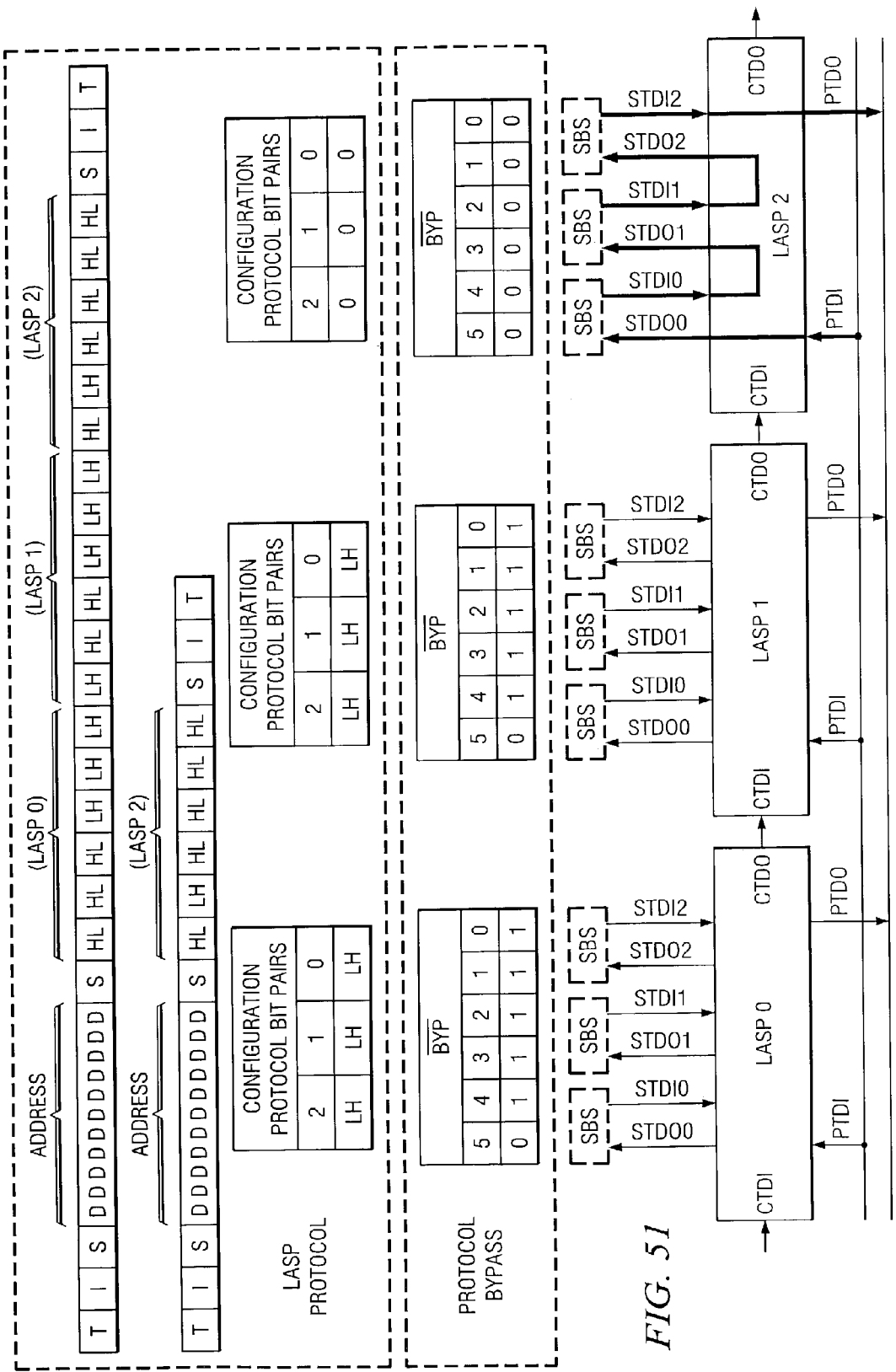

FIG. 51 is an illustration of primary to secondary TAPs connections and scan data path of three cascaded LASPs using LASP Protocol or protocol bypass inputs. Here during the select protocol, Position and Configuration for the first and second LASP are not received or if received their configuration bits are decoded as "111". The third LASP in cascade chain has all three secondary TAPs active and now behaves as a single device (not cascaded). The first and second LASPs have all three secondary TAPs inactive. When protocol bypass inputs are used, the third LASP has its $BYP_4$ and $BYP_3$ inputs set LOW so that it behaves as a single LASP (not cascaded). The $BYP_4$ and $BYP_3$ inputs of first and second LASPs are set HIGH. The connections of LASP 2 to PTDI and PTDO and the SBSs are shown in bolded lines.

While the invention has been particularly shown and described with reference to preferred embodiments thereof, it is well understood by those skilled in the art that various changes and modifications can be made in the invention without departing from the spirit and scope of the invention as defined by the appended claims.

What is claimed is:

1. In a system for communicating between devices via a serial bus utilizing an addressable shadow port (ASP) circuit selected by sending a broadcast message over the serial bus containing an address of an ASP circuit to be selected, the improvement comprising:
   a plurality of output ports on the ASP circuit, each output port operable to connect a serial bus slave to the serial bus; and
   a first configuration code in the broadcast message for determining a route for data signals through the ASP circuit, whereby the serial path will include one, some or all serial bus slaves coupled to the output ports of the ASP circuit.

2. The system of claim 1 wherein the serial bus is a JTAG bus and the data signals are JTAG signals.

3. In a system for communicating between devices via a serial bus utilizing an addressable shadow port (ASP) circuit selected by sending a broadcast message over the serial bus containing an address of an ASP circuit to be selected, the improvement comprising:
   a cascade input line and cascade output line on the ASP circuit, the cascade input line operable to receive a data signal from another ASP circuit, the cascade output line operable to transmit a data signal to another ASP circuit, and
   a second configuration code in the broadcast message for determining if the ASP circuit operates as a stand alone circuit, or if it receives data on the cascade input line and if transmits data via the cascade output line.

4. The system of claim 3 wherein the serial bus is a JTAG bus and the data signals are JTAG signals.

5. In a system for communicating between devices via a serial bus utilizing an addressable shadow port (ASP) circuit selected by sending a broadcast message over the serial bus containing an address of an ASP circuit to be selected, a group of cascaded ASP circuits comprising:
   a first ASP circuit configured to receive input data on a test data input line and transmit output data on a cascade output line; and
   a last ASP circuit configured to receive input data on a cascade input line and transmit output data on a test data output line, wherein the last ASP circuit determines its position in the group of cascaded ASP circuits from position data sent in the broadcast message and determines that it is the circuit to send an acknowledgement message to a source of the broadcast message.

6. The system of claim 5 wherein the serial bus is JTAG bus.

7. The system of claim 6 wherein the source of the broadcast message is a serial bus master.

8. In a system for communicating between devices via a serial bus utilizing an addressable shadow port (ASP) circuit selected by sending a broadcast message over the serial bus containing an address of an ASP circuit to be selected, an ASP circuit comprising:
   a plurality of output ports, each output port being operable to connect a serial bus slave to the serial bus;
   a configuration circuit in the ASP circuit responsive to a first configuration code in the broadcast message for determining a route for data signals through the ASP circuit, whereby none, some or all serial bus slaves coupled to the output ports are in the path; and
   a bypass input on the ASP circuit for receiving a hard-wired bypass code that determines the configuration of the ASP circuit and overrules the configuration set by the configuration code in the broadcast message.

9. The system of claim 8 wherein the serial bus is JTAG bus.

* * * * *